United States Patent
Alrod et al.

(10) Patent No.: US 11,256,591 B2
(45) Date of Patent: Feb. 22, 2022

(54) DIE MEMORY OPERATION SCHEDULING PLAN FOR POWER CONTROL IN AN INTEGRATED MEMORY ASSEMBLY

(71) Applicant: Western Digital Technologies, Inc., San Jose, CA (US)

(72) Inventors: Idan Alrod, Herzliya (IL); Eran Sharon, Rishon Lezion (IL); Alexander Bazarsky, Holon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/891,348

(22) Filed: Jun. 3, 2020

(65) Prior Publication Data
US 2021/0382804 A1  Dec. 9, 2021

(51) Int. Cl.
| | | |
|---|---|---|
| G06F 11/30 | (2006.01) | |
| G06F 13/16 | (2006.01) | |
| G11C 16/14 | (2006.01) | |
| G06F 1/12 | (2006.01) | |
| G06F 1/08 | (2006.01) | |
| G11C 16/34 | (2006.01) | |
| G06F 9/48 | (2006.01) | |

(52) U.S. Cl.
CPC ............ *G06F 11/3062* (2013.01); *G06F 1/08* (2013.01); *G06F 1/12* (2013.01); *G06F 9/4881* (2013.01); *G06F 11/3037* (2013.01); *G06F 13/1605* (2013.01); *G11C 16/14* (2013.01); *G11C 16/3481* (2013.01)

(58) Field of Classification Search
CPC combination set(s) only.
See application file for complete search history.

(56) References Cited

U.S. PATENT DOCUMENTS

| | | |
|---|---|---|
| 7,701,764 B2 | 4/2010 | Nguyen |
| 8,335,123 B2 | 12/2012 | Sprouse |
| 8,429,436 B2 | 4/2013 | Fillingim et al. |
| 8,694,719 B2 | 4/2014 | Lassa et al. |
| 9,268,635 B2 | 2/2016 | Sharon et al. |
| 9,329,986 B2 | 5/2016 | Li et al. |
| 9,418,712 B1 | 8/2016 | Erez |
| 9,443,600 B2 | 9/2016 | Ghalam et al. |
| 10,013,345 B2 | 7/2018 | Erez et al. |
| 10,025,522 B2 | 7/2018 | Helmick |

(Continued)

*Primary Examiner* — Raymond N Phan
(74) *Attorney, Agent, or Firm* — Vierra Magen Marcus LLP

(57) ABSTRACT

Power regulation in an integrated memory assembly having control semiconductor dies and memory semiconductor is disclosed herein. A master control die regulates power usage by the integrated memory assembly. Each control die reports information about its expected power usage to the master control die. The master control die determines a plan that meets a power criterion for the integrated memory assembly. The plan may maximize the power usage in each time period, while staying within a power budget. The plan can include selecting which of the memory dies perform a memory operation (or phase of a memory operation) during a given time period. The master control die may send a die scheduling plan to each of the other control dies. Each die scheduling plan indicates when memory operations and/or phases of memory operations are to be performed.

19 Claims, 26 Drawing Sheets

(56) References Cited

U.S. PATENT DOCUMENTS

| | | | |
|---|---|---|---|
| 10,241,701 B2 | 3/2019 | Choi et al. | |
| 10,387,303 B2 | 8/2019 | Mehra et al. | |
| 10,459,644 B2 | 10/2019 | Mehra et al. | |
| 10,522,489 B1 | 12/2019 | Takiar et al. | |
| 10,565,123 B2 | 2/2020 | Song et al. | |
| 10,579,425 B1* | 3/2020 | Jacob | G06F 9/4843 |
| 2008/0263373 A1 | 10/2008 | Meier et al. | |
| 2010/0001379 A1* | 1/2010 | Lee | H01L 25/0657 |
| | | | 257/621 |
| 2012/0047317 A1 | 2/2012 | Yoon et al. | |
| 2012/0331207 A1 | 12/2012 | Lassa et al. | |
| 2013/0055185 A1* | 2/2013 | Bose | H01L 23/50 |
| | | | 716/120 |
| 2014/0085959 A1* | 3/2014 | Saraswat | G11C 7/10 |
| | | | 365/63 |
| 2014/0112079 A1 | 4/2014 | Wakrat et al. | |
| 2016/0117105 A1 | 4/2016 | Thangaraj et al. | |
| 2017/0148510 A1 | 5/2017 | Bazarsky et al. | |
| 2017/0256955 A1 | 9/2017 | Addepalli et al. | |
| 2018/0260152 A1 | 9/2018 | Bar et al. | |
| 2019/0341375 A1 | 11/2019 | Hirano et al. | |

\* cited by examiner

DIE MEMORY OPERATION SCHEDULING PLAN FOR POWER CONTROL IN AN INTEGRATED MEMORY ASSEMBLY

BACKGROUND

The strong growth in demand for portable consumer electronic devices is driving the need for high-capacity storage devices. Non-volatile semiconductor memory devices (also referred to herein as "non-volatile memory systems"), such as flash memory storage cards, are widely used to meet the ever-growing demands on digital information storage and exchange. Their portability, versatility and rugged design, along with their high reliability and large capacity, have made such memory devices ideal for use in a wide variety of host electronic devices, including for example digital cameras, digital music players, video game consoles, PDAs, cellular telephones, desktop computers, laptop computers, and notepad computers. Typically, the host electronic devices provides power to the non-volatile memory system.

Non-volatile semiconductor memory systems often contain multiple semiconductor dies ("memory dies") that each contain non-volatile memory cells that may be programmed to store data. It is common to control the memory dies with a memory controller that is separate from the memory dies. The memory controller typically communicates with the memory dies over a data bus using a standard communication protocol. In the case of NAND memory, the Open NAND Flash Interface (ONFI) may be used as the communication protocol. The memory dies may be operated by the memory controller in parallel in order to increase performance of the memory system. However, parallel operation is typically limited by the ability of the hosting device to provide power and/or current to the memory system. For example, there may be limits to peak power and/or average power. There are often limits to the peak current that can be provided from the host device to the memory system. The term "peak Icc" is sometimes used to refer to the peak amount of current that is allowed. If the peak current drawn by the memory system is too high, then the magnitude of the supply voltage may drop, which can result in operation failure in the memory system.

The relationship between current, voltage and power is well understood by those of ordinary skill. Regulation of current usage, with the voltage substantially constant, regulates power usage. For example, regulating (e.g., limiting) the peak current from a power supply with a substantially constant power supply voltage with also regulate (e.g., limit) the peak power. Hence, the term power regulation (whether peak or average), as used herein in the context of a power supply that has a substantially constant voltage, will be understood to include current regulation. As noted above, the voltage output of the power supply will typically not be constant if the current drawn is too high. However, such a power supply will still be able to maintain a substantially constant voltage when below the allowed peak current.

Much of the power and/or current that is used by the memory system is used to perform memory operations such as programming the memory cells on the memory dies. Hence, the regulation of the power and/or current used by the memory dies is important in order to keep the current of the entire memory system within an allowed amount. Thus, it is common to limit the amount of power and/or current that may be drawn by the memory dies.

One possible technique to control current consumption is to have circuitry in the memory die to monitor the current consumption by that particular memory die. If the current consumption of the memory die exceeds a limit, the memory die temporarily suspends memory operations. A drawback of this technique is that a memory die could suspend its memory operations at a time when other memory dies in the memory system are not using much current. Thus, it may not actually be necessary to suspend memory operations in order to keep the total current usage of the memory system within an allowed amount.

Another possible technique to control current consumption is for the memory controller regulate power and/or current consumption of the memory dies. However, this solution typically requires information to be transferred over the aforementioned data bus (such as an ONFI bus). Such data transfers can potentially degrade memory system performance. Moreover, it can be difficult to provide the memory controller with detailed knowledge of the power usage of the memory dies. For example, program operations may involve multiple program and verify loops. The number of such loops, and hence the amount of power that the complete program operation will use, is unknown prior to initiating the program operation.

DETAILED DESCRIPTION

Figure 1A:
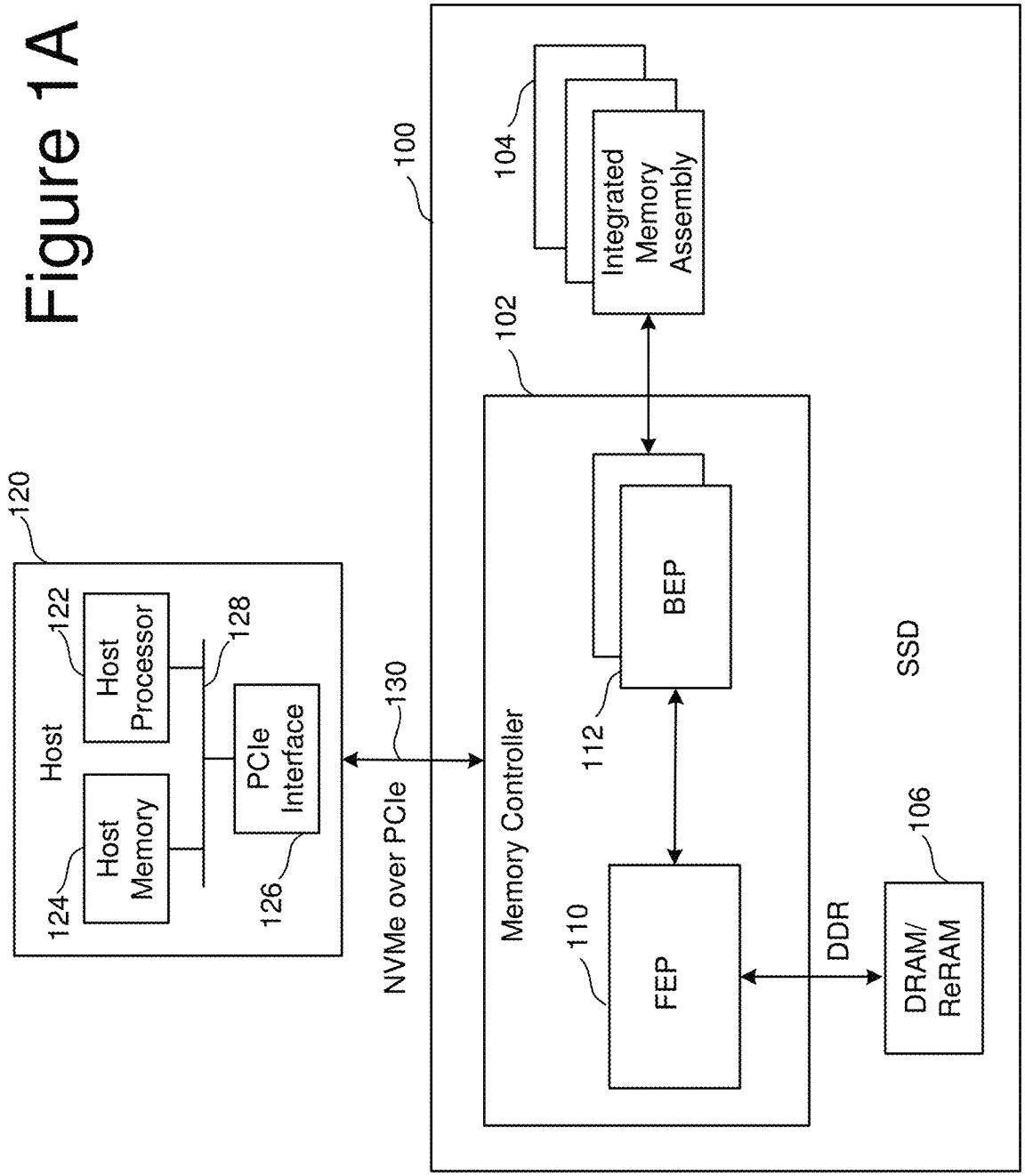
FIG. 1A is a block diagram of one embodiment of a memory system connected to a host.

The present technology will now be described with reference to the figures, which in embodiments, relate to power and/or current regulation in an integrated memory assembly having control semiconductor dies and memory semiconductor dies. The memory semiconductor die (or "memory die") contains non-volatile memory cells. The control semiconductor dies (or "control dies") contain control circuits that control memory operations in the memory dies. In one embodiment, the integrated memory assembly has a stack of the control dies and memory dies. In some embodiment, the control dies and memory dies are affixed to each other by, for example, bond pads.

In some embodiments, one of the control dies in the integrated memory assembly serves as a master control die that regulates power and/or current usage by the integrated memory assembly. In an embodiment, each control die reports information about its expected power and/or current usage to the master control die. For example, each control die may report expected current usage for each of a number of upcoming time periods (for the memory die controlled by the respective control die). The master control die then determines a plan that meets a power and/or current criterion for the integrated memory assembly. In one embodiment, the master control die determines a plan that will maximize the current usage in each time period, while staying within a current budget. The plan can include selecting which of the memory dies perform a memory operation (or phase of a memory operation) during a given time period. In one embodiment, the master control die sends a die scheduling plan to each of the other control dies. Each die scheduling plan indicates when memory operations and/or phases of memory operations are to be performed.

Because the master control die has power/current (note that "power/current" will be used herein the mean power and/or current) information about all of the memory dies in the integrated memory assembly, the master control die is able to develop a plan that wisely uses the allowed power/current. For example, the master control die may maximize power/current usage during each time period, which helps improve performance. For example, a memory die could be allowed to use a large amount of power/current over a few time periods, provided that the total power/current usage of all of the memory dies does not exceed an allowed budget. If the plan were instead to limit the power/current of every memory die to some fixed threshold regardless of current usage of other memory dies, then memory dies might be un-necessarily shut time.

Also, no information needs to be transferred over a data bus between the integrated memory assembly and a memory controller to regulate the power and/or current usage of the integrated memory assembly. In some embodiments, the memory controller communicates with the control dies over an ONFI data bus. However, in some embodiments, the communication between the master control die and the other control dies in the integrated memory assembly does not take place over the ONFI data bus. Hence, communication over the ONFI data bus is not negatively impacted.

Moreover, the master control die is able to develop the power/current plan based on detailed information about memory operations in the memory dies. It might not be practical, or even possible, to provide such detailed information to the memory controller. For example, the power/current usage can vary significantly for different phases of a memory operations, such as a program operation. The program operation can include a program phase followed by a verify phase (the two phases may be referred to as a program loop). Multiple program loops can be performed until the verify phase indicates that the memory cells are programmed. The power/current draw can be significantly different for the program step than the verify phase. In some embodiments, the control dies report expected power/current information to the master control die for each phase of a program operation, which allows fine-grained control. Also, in some embodiments, the control dies report to the master when a program operation is complete, which allows the master control die to re-allocate some power/current budget for a specific time period to another control die. Thus, power/current usage in each time period can be maximized.

In some embodiments, the control die and the memory die are bonded together with many bond pads that permit communication between the control die and the memory die. In one embodiment, the control die is able to access data from the memory die through the bond pads. In one embodiment, each data bit and each parity bit of a codeword is read by way of a different bond pads. This, in effect, provides an interface that is much wider than a data bus between the integrated memory assembly and the memory controller. Therefore, transferring the codewords from the memory die to the control die is very efficient.

In some embodiments, the control die and the memory die are fabricated on different semiconductor wafers, which permits use of different semiconductor fabrication processes on the different wafers. For example, semiconductor fabrication processes may involve high temperature anneals. Such high temperature anneals may be needed for proper formation of some circuit elements, but could be damaging to other circuit elements. It can be challenging to form complex circuitry such as decoders on the memory die due to limitations of semiconductor fabrication processes. Also, the fabrication process that is used to form memory cells on the memory die may place constraints on the size of the transistors that are formed on the memory die. In some embodiments, the control circuitry on the control die has transistors that are a different size (e.g., smaller) than memory cell transistors on the memory die. The different (e.g., smaller) size of the transistors on the control die may improve performance of the control circuitry on the control die. For example, smaller transistors may use less power than larger transistors. Also, using smaller transistors allows one embodiment of a control die to have more transistors for control circuitry on the control die. Hence, the control die may be better suited to perform operations such as determining new read reference levels than the memory die.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

FIG. 1A-FIG. 3B describe one example of a memory system that can be used to implement the technology disclosed herein.

FIG. 1A is a block diagram of one embodiment of a memory system 100 connected to a host 120. Memory system 100 can implement the technology disclosed herein. Many different types of memory systems can be used with the technology disclosed herein. One example memory system is a solid state drive ("SSD"); however, other types of memory systems can also be used. Memory system 100 comprises a memory controller 102, integrated memory assembly 104 for storing data, and local memory (e.g. DRAM/ReRAM) 106. Memory controller 102 comprises a Front End Processor Circuit (FEP) 110 and one or more Back End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the integrated memory assemblies/die at the request of FEP circuit 110. In some embodiments, an integrated memory assembly is referred to as a memory package. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit. The term apparatus may be used herein to refer to any of, but not limited to, integrated memory assembly 104, memory system 100, memory controller 102, or the combination of memory system 100 and host 120.

In one embodiment, there are a plurality of integrated memory assemblies 104. In an embodiment, each integrated memory assembly 104 includes one or more memory die and one or more control die. Each memory die may include one or more memory structures. A control die controls operation of a memory die. For example, a control die may control read, write, and erase operations on a memory die. In one embodiment, the memory controller 102 communicates with a control die in order to instruct the control die to perform read, write, or erase operations on one or more non-volatile memory die or one or more memory structures. In one embodiment, each memory die in the integrated memory assembly 104 utilize NAND flash memory (including two dimensional NAND flash memory and/or three dimensional NAND flash memory). In other embodiments, the integrated memory assembly 104 can include other types of memory; for example, the memory package can include PCM memory.

Memory controller 102 communicates with host 120 using an interface 130 that implements NVM Express (NVMe) over PCI Express (PCIe). For working with memory system 100, host 120 includes a host processor 122, host memory 124, and a PCIe interface 126, which communicate over bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
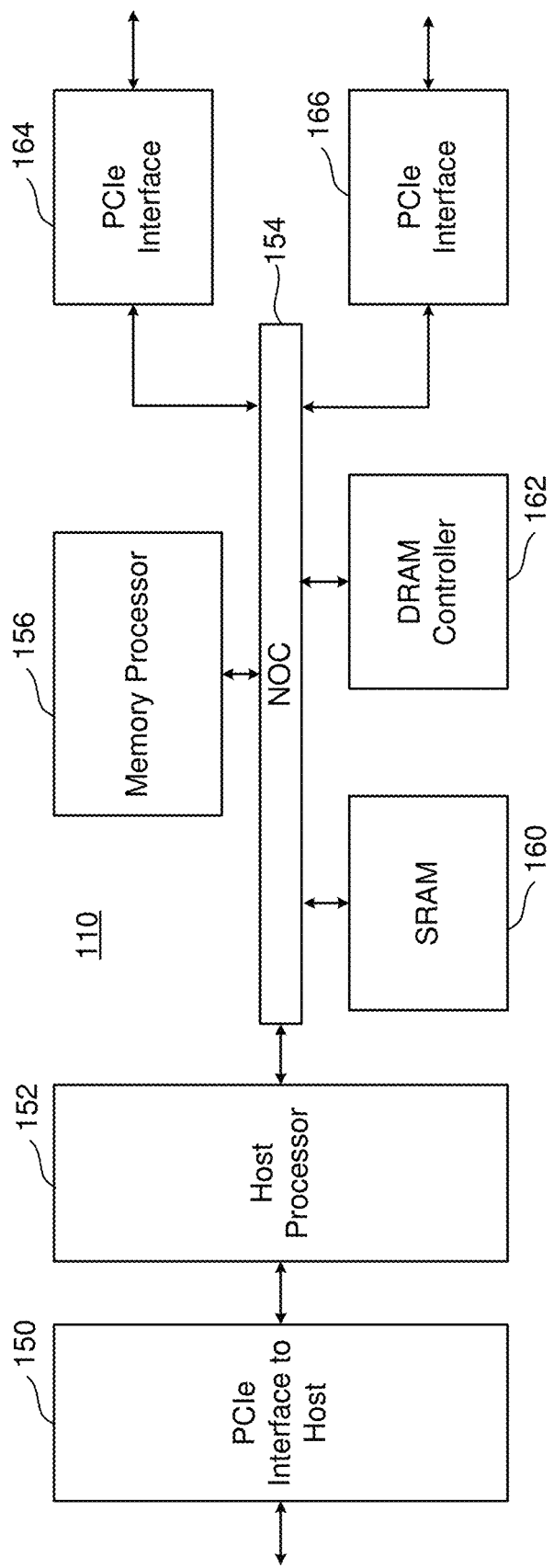
FIG. 1B is a block diagram of one embodiment of a Front End Processor Circuit.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 2:
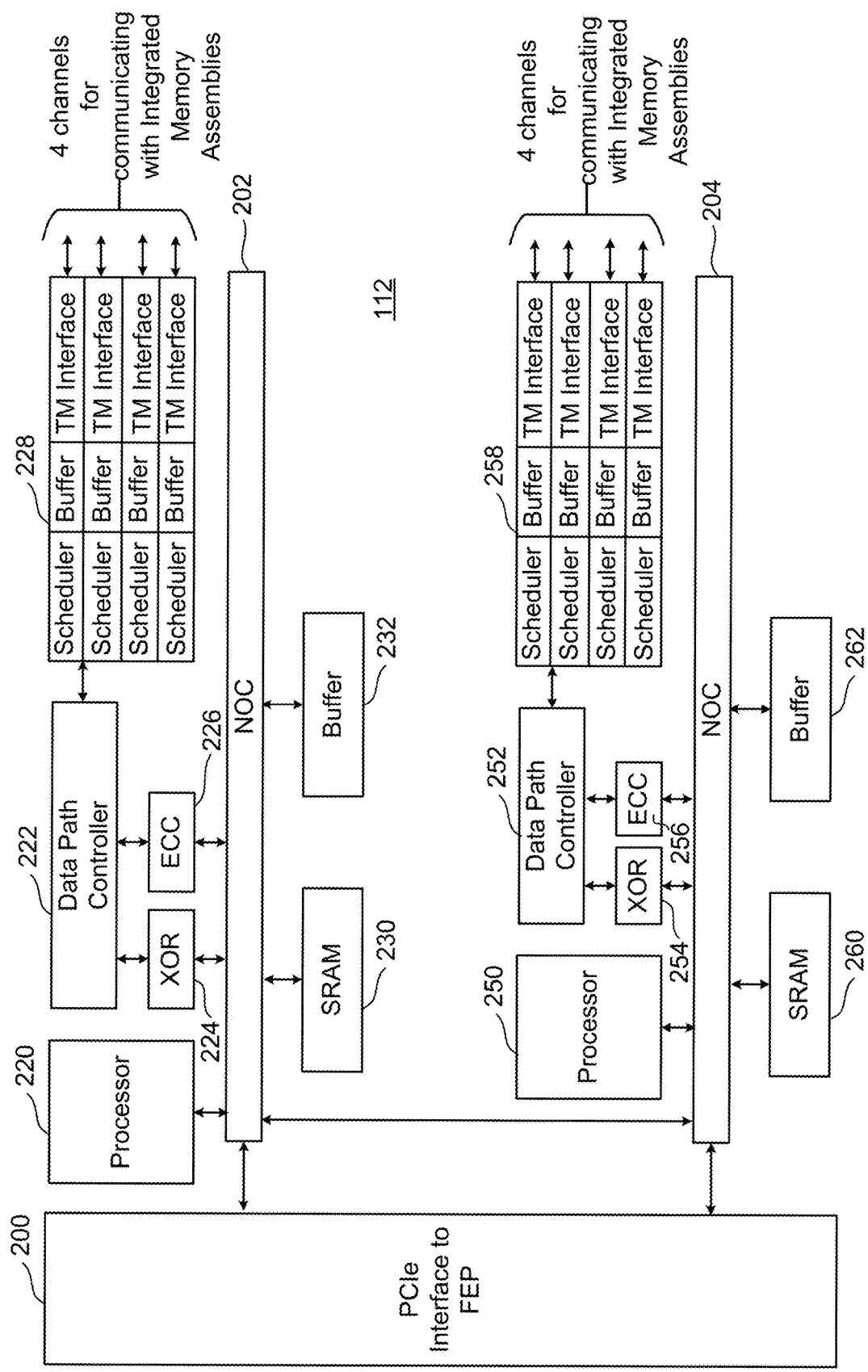
FIG. 2 is a block diagram of one embodiment of a Back End Processor Circuit.

FIG. 2 is a block diagram of one embodiment of the BEP circuit 112. FIG. 2 shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256), and a read reference voltage calibration engine (225/255). The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254, ECC engines 226/256, and read reference voltage calibration engines (225/255) are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2. Additionally, controllers with structures different than FIGS. 1B and 2 can also be used with the technology described herein.

Figure 3:
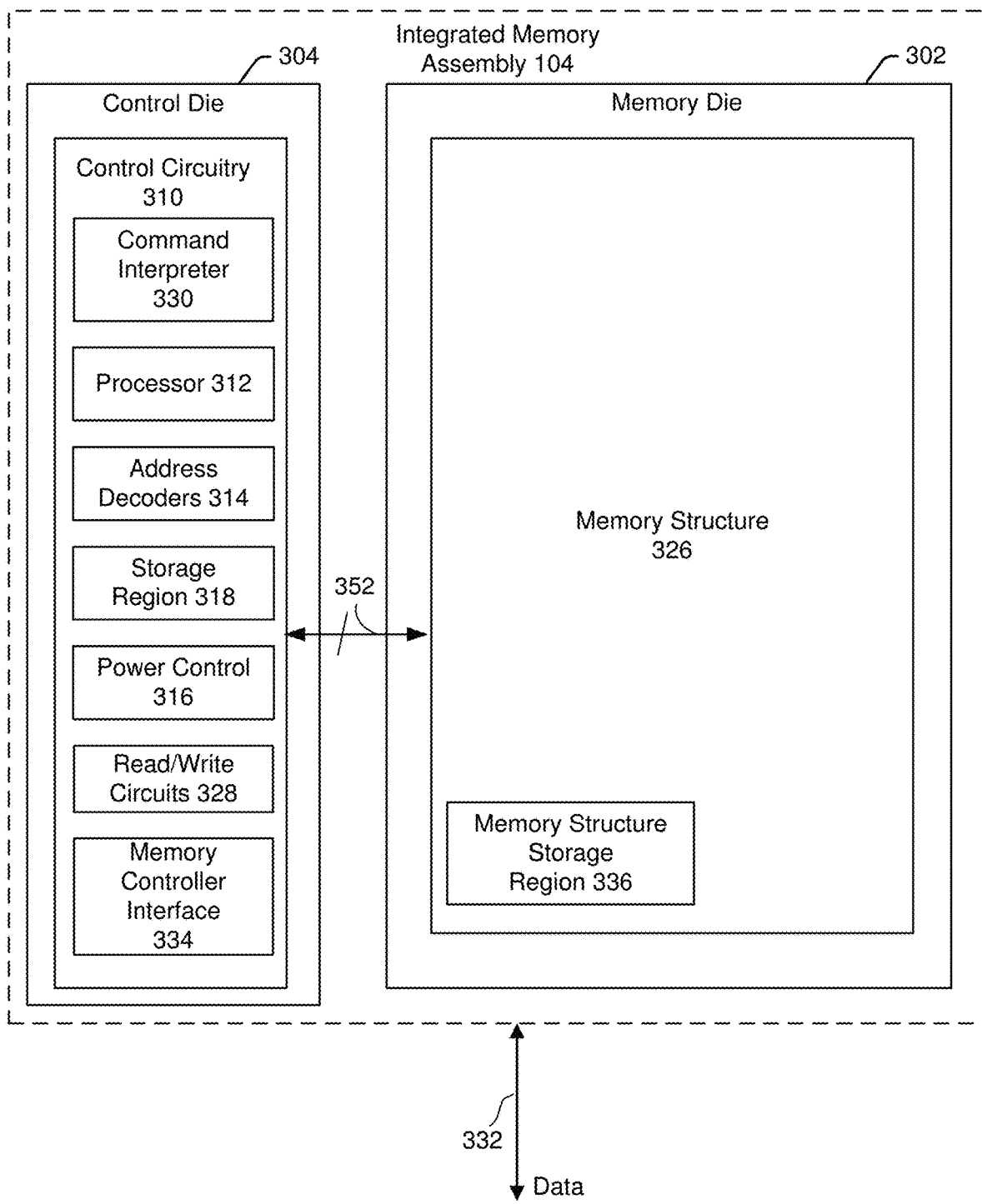
FIG. 3 is a functional block diagram of an embodiment of an integrated memory assembly.

FIG. 3 is a functional block diagram of one embodiment of an integrated memory assembly 104. In one embodiment, the integrated memory assembly 104 includes two types of semiconductor die (or more succinctly, "die"). One type is referred to herein as a control die 304, the other type is referred to herein as a memory die 302. Memory die 302 includes memory structure 326. Memory structure 326 may contain non-volatile memory cells. Control die 304 includes control circuitry 310. In some embodiments, the memory die 302 and the control die 304 are bonded together, as will be described in more detail below. Typically, there are multiple control dies 304 and multiple memory dies 302 in an integrated memory assembly 104.

The control circuitry 310 performs memory operations (e.g., write, read, erase and others) on memory structure 326. The control circuitry 310 includes processor 312, an on-chip address decoders 314, a power control circuit 316, a storage region 318, read/write circuits 328, a command interpreter 330, and memory controller interface 334. In another embodiment, a portion of the read/write circuits 328 are located on control die 304, and a portion of the read/write circuits 328 are located on memory die 302. For example, the read/write circuits 328 may contain sense amplifiers. In one embodiment, the sense amplifiers are located on the control die 304. In one embodiment, the sense amplifiers are located on the memory die 302.

Herein, the term, "memory die," "memory semiconductor die," or the like, means a semiconductor die that contains non-volatile memory cells for storage. Herein, the term, "control die," "control semiconductor die," or the like, means a semiconductor die that contains control circuitry for performing memory operations on non-volatile memory cells on a memory die. Typically, numerous semiconductor die 304 are formed from a single semiconductor (e.g., silicon) wafer. Typically, numerous memory die 302 are formed from a single semiconductor (e.g., silicon) wafer.

The processor 312 is programmable and reprogrammable. The processor 312 may be a microprocessor. In one embodiment, the processor has a reduced instruction set computer (RISC) architecture. The processor 312 executes program instructions in order to control the memory die 302. The processor 312 controls operation of address decoders 314, power control 316, and read/write circuits 328. Thus, processor 312 is able to control memory operations in the memory structure 326. In some embodiments, the processor 312 executes instructions in order to regulate power and/or current usage of the integrated memory assembly 104. In some embodiments, processor 312 is replaced with a hard-wired state machine. Thus, a hard-wired state machine may be used to control operation of address decoders 314, power control 316, and read/write circuits 328, and hence control memory operations in the memory structure 326. In some embodiments, the control die 304 has both a hard-wired state machine and a processor (e.g., microprocessor).

The storage region 318 may be used to store the program instructions that are executed on the processor 312. The storage region 318 may be used to store various parameters and settings that are used to control the memory die 302. For example, the parameters and settings could include voltage levels of signals applied to the memory structure 326. The storage region 318 could contain either volatile memory (e.g., SRAM, DRAM) or non-volatile memory.

The memory structure 326 also has a memory structure storage region 336 to store program instructions that are executed on the processor 312. The memory structure storage region 336 may be used to store various parameters and settings that are used to control the memory die 302. In some embodiments, the control die 304 transfers program instructions, parameters, settings, and the like from memory structure storage region 336 to storage region 318 when the integrated memory assembly 104 is initialized (e.g., booted). In an embodiment, the control die 304 has hardware (e.g., a hard-wired state machine) to control the transfer from memory structure storage region 336 to storage region 318. The memory structure storage region 336 may be implemented in non-volatile memory cells that are not used to store user data.

In some embodiments, the program instructions that are executed by the processor 312 are updated by replacing a portion of the program instructions with updated (or modified) instructions. Various parameters and/or settings may also be updated. Such updates allows changes to be made to how the processor 312 operates the memory die 302. Such updates (or changes) may not be possible or practical to make in hardware, such as a hard-wired state machine.

Each memory structure 326 is addressable by word lines via a row decoder (not depicted in FIG. 3) and by bit lines via a column decoder, in some embodiments. The on-chip address decoder 314 provides an address interface between addresses used by host 120 or memory controller 102 to the hardware address used by row decoders and column decoders (not expressly depicted in FIG. 3). Power control circuit 316 controls the power and voltages supplied to the word lines, bit lines, and select lines during memory operations. Power control circuit 316 may include voltage generators (e.g., charge pumps) for generating voltages. The power control circuit 316 executes under control of the processor 312.

The read/write circuits 328 includes sense blocks (which may contain sense amplifies (SA)), in some embodiments. The sense amplifies include bit line drivers, in some embodiments. The read/write circuits 328 executes under control of the processor 312.

The command interpreter 330 is able to interpret commands that are provided by the memory controller 102. For example, the command interpreter 330 may interpret read, write, erase, and other commands. In some embodiments, the command interpreter 330 is implemented in hardware, such as a state machine. Optionally, the command interpreter 330 may be implemented by software that executes on the processor 312.

Memory controller interface 334 is an electrical interface for communicating with memory controller 102. For example, memory controller interface 334 may implement a Toggle Mode Interface that connects to the Toggle Mode interfaces of memory interface 228/258 for memory controller 102. In one embodiment, memory controller interface 334 includes a set of input and/or output (I/O) pins that connect to communication channel 332 (also refers to herein as a data bus). In one embodiment, communication channel 332 connects to the memory controller 102 as part of the Toggle Mode Interface. In one embodiment, a communication channel 332 of one integrated memory assembly 104 connects to another integrated memory assembly 104.

Communication channel 332 is depicted as being connected to integrated memory assembly 104 for generality. Communication channel 332 may connect to either or both of die 302 and/or 304. In one embodiment, communication channel 332 connects memory controller 102 directly to control die 304. In one embodiment, communication channel 332 connects memory controller 102 directly to memory die 302. If communication channel 332 connects memory controller 102 directly to memory die 302, then pathway 352 may be used to allow communication between memory controller 102 and control circuitry 310.

Any subset of components in the control circuitry 310 can be considered one or more control circuits. Processor 312, command interpreter 330, read/write circuits 328, and/or memory controller 102 (or equivalently functioned circuits), in combination with all or a subset of the other circuits depicted in FIG. 3, can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 352 are pathways between one or more components in the control circuitry 310 and the memory structure on memory die 302. A portion of each pathway resides in the memory die 302 and a portion of each pathway reside in the control die 304. The term pathway may be used for portion of pathways 352 that is entirely within one of the die. Thus, it may be stated that the memory die 302 has a first plurality of pathways and that the control die 304 has a second plurality of pathways. In one embodiment, the control die 304 and the memory die 302 are configured to transfer signals through pathway pairs of the first plurality of pathways and the second plurality of pathways. In some embodiments, the memory die 302 and the control die 304 are bonded to each other, or otherwise attached to each other, to facilitate signal transfer through the pathway pairs.

A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal. Pathways 352 allow the control circuitry 310 to provide voltages to word lines, select lines, and bit lines on memory die 302, in one embodiment. Pathways 352 may be used to receive signals from, for example, bit lines. In one embodiment, there are about 100,000 pathways 352. However, there could be more or fewer than 100,000 pathways. Having such a large number of pathways 352 allows a very large amount of data, or other signals, to be passed in parallel.

In one embodiment, memory structure 326 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 326 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include phase change memory (e.g., PCM), and the like. Examples of suitable technologies for memory cell architectures of the memory structure 326 include two-dimensional arrays, three-dimensional arrays, cross-point arrays, stacked two-dimensional arrays, vertical bit line arrays, and the like.

A person of ordinary skill in the art will recognize that the technology described herein is not limited to a single specific memory structure, but covers many relevant memory structures within the spirit and scope of the technology as described herein and as understood by one of ordinary skill in the art.

Although FIG. 3 depicts one control die 304 and one memory die 302 in an integrated memory assembly 104, there may be more than one control die 304 and more than one memory die 302 in an integrated memory assembly 104. In some cases, a single control die 304 may control more than one memory die 302.

Typically, there are multiple control dies 304 and multiple memory dies 302 in an integrated memory assembly 104. In some embodiments, one of the control dies 304 is a master control die. In some embodiments, the master control die determines a power plan for operating memory operations in the integrated memory assembly 104. The processor 312 may be used to determine the power plan based on future memory operations (and/or phases of memory operations) to be performed in the memory dies 302 in the integrated memory assembly 104. Each control die 304 in the integrated memory assembly 104 may send the master control die information about future power consumption, such that the master control die may determine the power plan. In some embodiments, the master control die determines which memory dies 304 are to perform memory operations in each of several upcoming time periods. In an embodiment, the master control die sends a scheduling plan to the each other control die that indicates when the control die should execute a memory operation (or phase thereof) in the memory die it controls.

Figure 4:
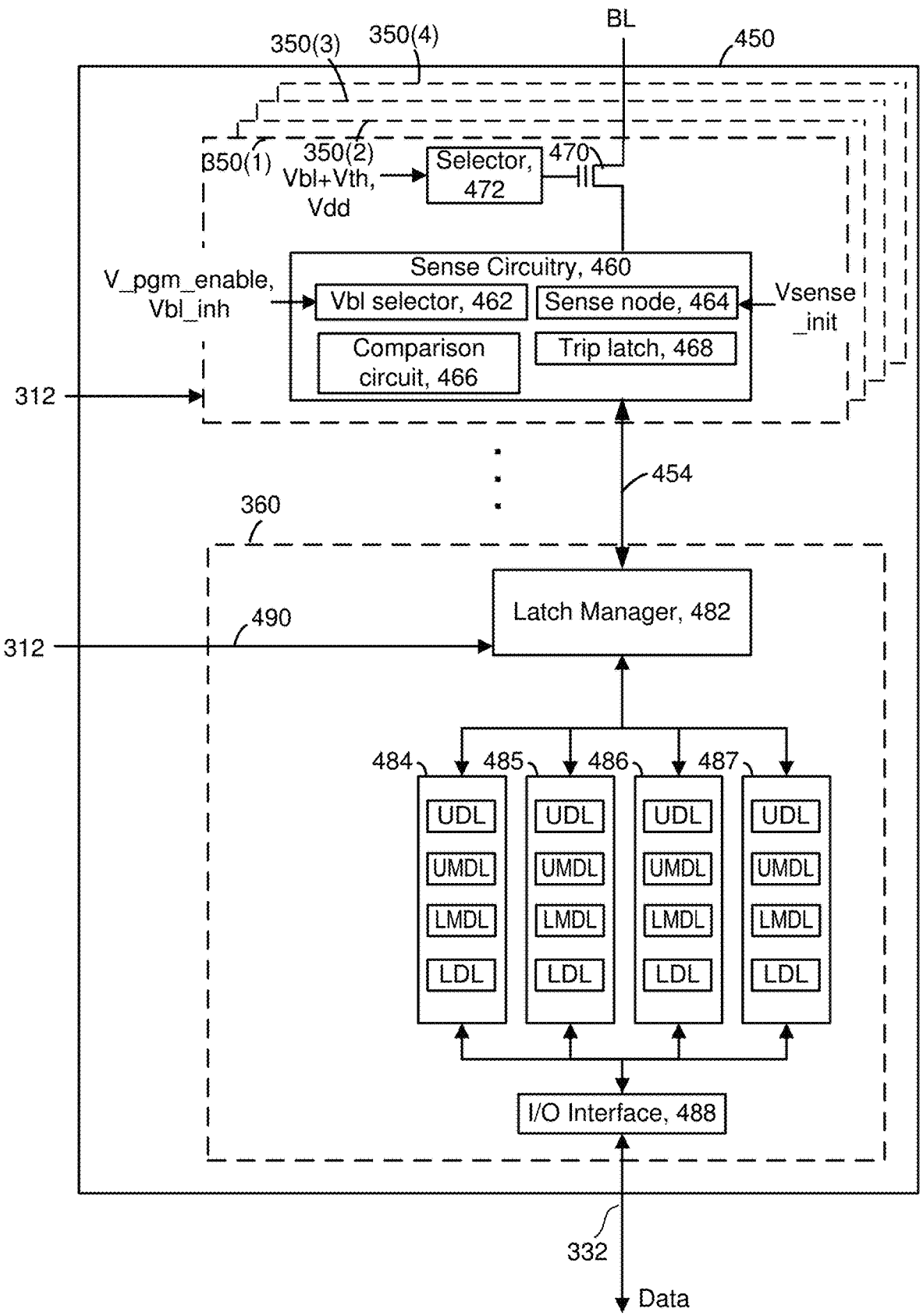
FIG. 4 is a block diagram depicting one embodiment of a sense block.

FIG. 4 is a block diagram depicting one embodiment of a sense block 450, which operates under control of processor 312. The sense block is part of the read/write circuits 328. There may be many sense blocks 450 in the read/write circuits 328. An individual sense block 450 is partitioned into one or more core portions, referred to as sense circuits or sense amplifiers 350(1)-350(4), and a common portion, referred to as a managing circuit 360. In one embodiment, there will be a separate sense amplifier for each bit line/NAND string and one common managing circuit 360 for a set of multiple, e.g., four or eight, sense amplifier. Each of the sense amplifier in a group communicates with the associated managing circuit 360 via data bus 454. Thus, there are one or more latch managing circuits which communicate with the sense amplifier of a set of storage elements (memory cells). The processor 312 controls the overall operation of the sense amplifiers 350 and the managing circuit 360; however, some aspects of the sense amplifiers 350 and managing circuit 360 may operate independent of control from the processor 312.

The sense amplifier 350(1), as an example, comprises sense circuitry 460 that performs sensing by determining whether a conduction current in a connected bit line is above or below a predetermined threshold level. The sensing can occur in a read or verify operation. The sense amplifier also supplies a bit line voltage during the application of a program voltage in a program operation. The processor 312 controls the timing and magnitude of the bit line voltages.

The sense circuitry 460 may include a Vbl selector 462, a sense node 464, a comparison circuit 466 and a trip latch 468. During the application of a program voltage, the Vbl selector 462 can pass a program enable voltage (e.g., V_pgm_enable) or a program-inhibit voltage (e.g., Vbl_inh) to a bit line connected to a memory cell. Herein, a "program enable voltage" is defined as a voltage applied to a memory cell that enables programming of the memory cell while a program voltage (e.g., Vpgm) is also applied to the memory cell. In certain embodiments, a program enable voltage is applied to a bit line coupled to the memory cell while a program voltage is applied to a control gate of the memory cell. Herein, a "program inhibit voltage" is defined as a voltage applied to a bit line coupled to a memory cell to inhibit programming of the memory cell while a program voltage (e.g., Vpgm) is also applied to the memory cell (e.g., applied to the control gate of the memory cell). Note that boosting voltages (e.g., Vpass) may be applied to unselected word lines along with the program inhibit voltage applied to the bit line.

Program inhibit voltages are applied to bit lines coupled to memory cells that are not to be programmed and/or bit lines having memory cells that have reached their respective target threshold voltage through execution of a programming process. These may be referred to as "unselected bit lines." Program inhibit voltages are not applied to bit lines ("selected bit lines") having a memory cell to be programmed. When a program inhibit voltage is applied to an unselected bit line, the bit line is cut off from the NAND channel, in one embodiment. Hence, the program inhibit voltage is not passed to the NAND channel, in one embodiment. Boosting voltages are applied to unselected word lines to raise the potential of the NAND channel, which inhibits programming of a memory cell that receives the program voltage at its control gate.

A transistor 470 (e.g., an nMOS) can be configured as a pass gate to pass Vbl from the Vbl selector 462, by setting the control gate voltage of the transistor sufficiently high, e.g., higher than the Vbl passed from the Vbl selector. For example, a selector 472 may pass a power supply voltage Vdd, e.g., 3-4 V to the control gate of the transistor 470.

The sense amplifier 350(1) is configured to control the timing of when the voltages are applied to the bit line under control of processor 312. During sensing operations such as read and verify operations, the bit line voltage is set by the transistor 470 based on the voltage passed by the selector 472. The bit line voltage is roughly equal to the control gate voltage of the transistor minus its Vt (e.g., 3 V). For example, if Vbl+Vt is passed by the selector 472, the bit line voltage will be Vbl. This assumes the source line is at 0 V. The transistor 470 clamps the bit line voltage according to the control gate voltage and acts as a source-follower rather than a pass gate. The Vbl selector 462 may pass a relatively high voltage such as Vdd which is higher than the control gate voltage on the transistor 470 to provide the source-follower mode. During sensing, the transistor 470 thus charges up the bit line.

In one approach, the selector 472 of each sense amplifier can be controlled separately from the selectors of other sense amplifiers, to pass Vbl or Vdd. The Vbl selector 462 of each sense amplifier can also be controlled separately from the Vbl selectors of other sense amplifiers.

During sensing, the sense node 464 is charged up to an initial voltage such as Vsense_init=3 V. The sense node is then connected to the bit line via the transistor 470, and an amount of decay of the sense node is used to determine whether a memory cell is in a conductive or non-conductive state. In one embodiment, a current that flows in the bot line discharges the sense node (e.g., sense capacitor). The length of time that the sense node is allowed to decay may be referred to herein as an "integration time." The comparison circuit 466 is used to compare the sense node voltage to a trip voltage at a sense time. If the sense node voltage decays below the trip voltage Vtrip, the memory cell is in a conductive state and its Vt is at or below the voltage of the verification signal. If the sense node voltage does not decay below Vtrip, the memory cell is in a non-conductive state and its Vt is above the voltage of the verification signal. The sense amplifier 350(1) includes a trip latch 468 that is set by the comparison circuit 466 based on whether the memory cell is in a conductive or non-conductive state. The data in the trip latch can be a bit which is read out by the latch manager 482. In some embodiments, the processor 312 performs computations, such as to determine the data stored in the sensed memory cell. To make such computations, the latch manager 482 may provide the processor 312 with data (e.g., a bit) from the trip latch 468.

The managing circuit 360 comprises a latch manager 482, four example sets of data latches 484, 485, 486, 487 and an I/O Interface 488 coupled between the sets of data latches and data bus 332 (data bus may connect to the memory controller 102). One set of data latches, e.g., comprising individual latches LDL, LMDL, UMDL, and UDL, can be provided for each sense amplifier. In some cases, fewer or additional data latches may be used. LDL stores a bit for a lower page of data, LMDL stores a bit for a lower-middle page of data, UMDL stores a bit for an upper-middle page of data, and UDL stores a bit for an upper page of data. This is in a sixteen level or four bits per memory cell memory device. In one embodiment, there are eight levels or three bits per memory cell.

The latch manager 482 operates under control of the processor 312. The latch manager 482 may, however, perform some operations independent of control of the processor 312. In some embodiments, latch manager 482 is implemented in hardware, which may include but is not limited to discrete logic (e.g., XOR gates, AND gates, invertors, etc.). In some embodiments, the latch manager 482 performs computations, such as to determine the data stored in the sensed memory cell. In one embodiment, to determine the data stored in the sensed memory cell, the latch manager 482 may contain discrete logic, such as, but not limited to XOR gates. The latch manager 482 may also contain latches that may be used to store information to facilitate determining the data stored in the sensed memory cell. However, determining the data stored in the sensed memory cell using discrete logic may have limitations such as not being able to change a page mapping scheme. In some embodiments, using the processor 312 to determine the data in the memory cell allows the page mapping scheme to be changed. Further details of embodiments of changing a page mapping scheme are described below.

The determined data (whether determined by processor 312 or independently by latch manager 482) may be stored in the set of data latches. Each set of data latches 484-487 is used to store data bits determined during a read operation, and to store data bits imported from the data bus 332 during a program operation which represent write data meant to be programmed into the memory. I/O interface 488 provides an interface between data latches 484-487 and the data bus 332.

In one embodiment, the latch manager 482 is used to determine what voltage to apply to the bit line, based on the state of the latches. Thus, the latch manager 482 may perform some operations independent of processor 312, thus alleviating the need for the processor 312 to perform all computations and/or decisions.

During reading, the operation of the system is under the control of processor 312 that controls the supply of different control gate voltages to the addressed memory cell. As it steps through the various predefined control gate voltages corresponding to the various memory states supported by the memory, the sense circuitry 460 may trip at one of these voltages and a corresponding output will be provided from sense circuitry 460 to latch manager 482 via the data bus 454. In one embodiment, the latch manager 482 determines the resultant memory state by consideration of the tripping event(s) of the sense circuitry 460 and the information about the applied control gate voltage from the processor 312 via input lines 490. The latch manager 482 then computes a binary encoding for the memory state and stores the resultant data bits into data latches 484-487.

During program or verify operations for memory cells, the data to be programmed (write data) is stored in the set of data latches 484-487 from the data bus 332, in the LDL, LMDL, UMDL, and UDL latches, in a four-bit per memory cell implementation.

The program operation, under the control of the processor 312, applies a set of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, latch manager 482 monitors the read back memory state relative to the desired memory state. When the two are in agreement, the latch manager 482 sets the bit line in a program inhibit mode such as by updating its latches. This inhibits the memory cell coupled to the bit line from further programming even if additional program pulses are applied to its control gate.

Each set of data latches 484-487 may be implemented as a stack of data latches for each sense amplifier. In one embodiment, there are three data latches per sense amplifier 350. In some implementations, the data latches are implemented as a shift register so that the parallel data stored therein is converted to serial data for data bus 332, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operation. For example, latches may identify that a memory cell's Vt is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An LMDL, UMDL or UDL latch is flipped when a lower-middle, upper-middle or upper page bit, respectively, is stored in an associated memory cell. This occurs when an associated memory cell completes programming.

Figure 5:
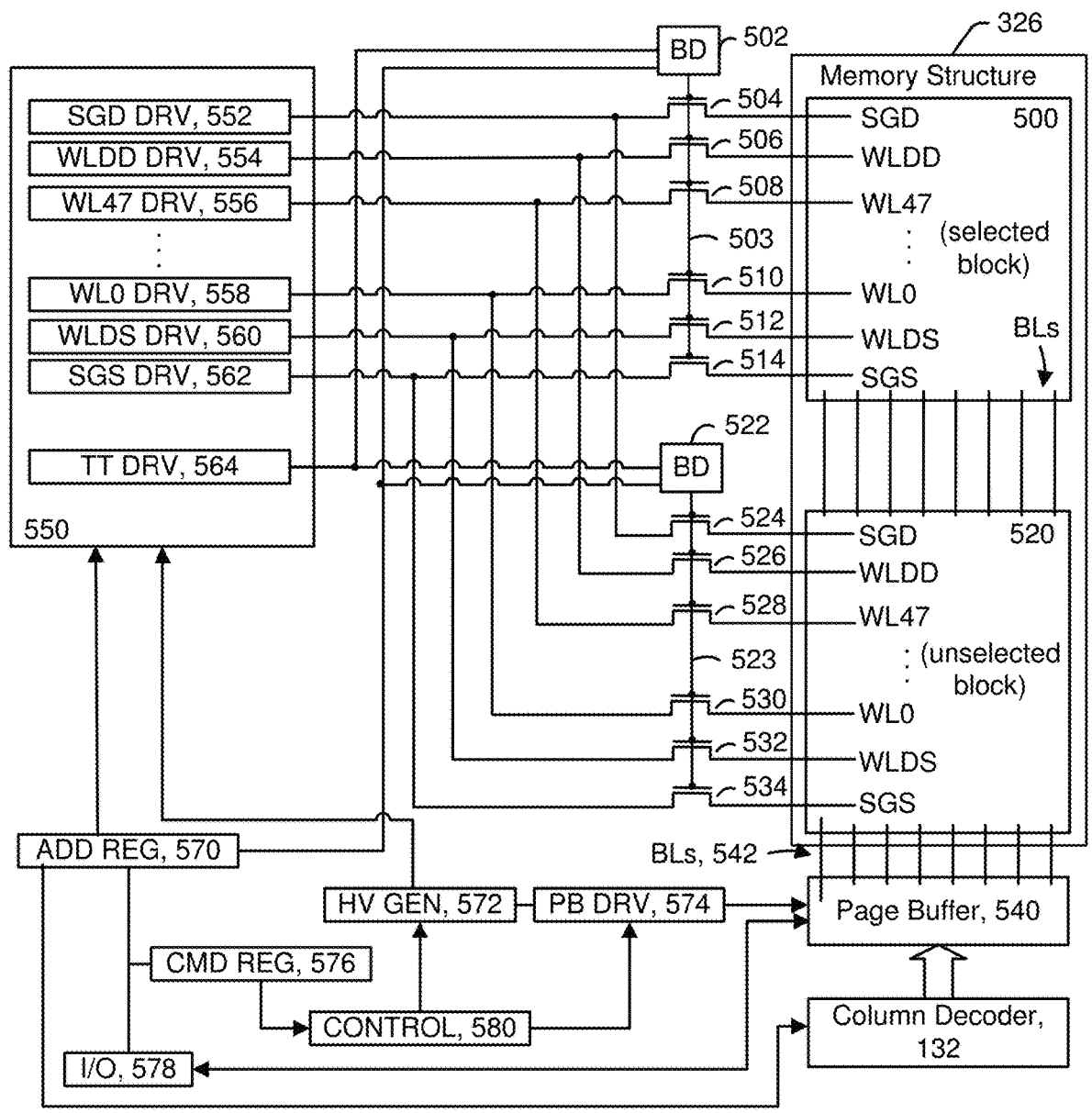
FIG. 5 is a diagram that shows further details of one embodiment of circuitry for applying voltages to a memory structure in a memory die.

FIG. 5 is a diagram that shows further details of one embodiment of circuitry for applying voltages to a memory structure 326 in a memory die 302. Two blocks 500, 520 of memory cells are depicted. These are two of many blocks in the memory structure 326. In one embodiment, the rest of the circuitry in FIG. 5 resides on the control die 304. However, some of the other circuitry could reside on the memory die 302. In one embodiment, the page buffer 540 resides on the memory die 302. In one embodiment, both the page buffer 540 and the column decoder 132 reside on the memory die 302.

The circuitry in FIG. 5 operates under control of processor 312. Circuits of FIG. 5 apply voltages to word lines, select lines, and bit lines. For example, the processor 312 may issue control signals to one or more of CONTROL 580, HV (High Voltage) GEN (Generator) 572, PB (Page Buffer) DRV (Driver) 574, CMD (Command) REG (Register) 576, I/O (Input/Output) Buffer 578. In one embodiment, the processor 312 issues control signals to CONTROL 580, which in turn controls other elements such as HV GEN 572 and PB DRV 574.

A high voltage generator (HV GEN) 572 is connected to the word line driver 550 and to page buffer drivers (PB DRV) 574. The word line drivers 550 are controlled by the processor 312 to control magnitudes and timing of voltages to word lines and select lines in the memory structure 326, in one embodiment. PB DRV 574 is connected to page buffer 540 to control the page buffer 540. The page buffer 540 may include sense blocks, such as sense blocks 450 in FIG. 4. In one embodiment, the processor 312 controls the PB DRV 574 to control magnitude and timing of voltages applied to the bit lines (BLs) 542.

Each block of storage elements is associated with a set of transfer transistors, in one possible embodiment. For example, block 500, which is the selected block in this example, e.g., a block in which a programming or sense operation is to take place, includes a drain-side select gate (SGD) connected to a transfer transistor 504, a drain-side dummy word line (WLDD) connected to a transfer transistor 506, a word line (WL47) connected to a transfer transistor 508, intermediate word lines WL46-WL1 (not shown) connected to respective transfer transistors (not shown), a word line (WL0) connected to a transfer transistor 510, a source-side dummy word line (WLDS) connected to a transfer transistor 512, and a source-side select gate (SGS) connected to a transfer transistor 514. The control gate of each transfer transistor of the block 500 is connected to a block decoder (BD) 502 via a common path 503. The BD 502 receives a voltage from a transfer transistor driver (TT DRV) 564 and a control signal from an address register (ADD REG) 570. The control signal includes an address. If the address matches an address of the BD 502, the BD 502 acts as a conductive switch which passes the voltage to the control gates of the associated transfer transistors via path 503. If the address does not match the address of the BD 502, the BD 502 acts as a non-conductive switch which does not pass the voltage to the control gates of the associated transfer transistors.

Each transfer transistor may be an nMOSFET, for example, which has a drain node on the left hand side and a source node on the right hand side. The drain node for each transfer transistor is connected to a respective voltage driver in a set of high-voltage voltage drivers 550. Each driver may be provided a voltage from HV GEN 572. For example, the transfer transistor 504 is connected to a drain select gate driver (SGD DRV) 552, the transfer transistor 506 is connected to a dummy word line driver (WLDD DRV) 554, the transfer transistor 508 is connected to the word line driver (WL47 DRV) 556, . . . , the transfer transistor 510 is connected to the word line driver (WL0 DRV) 558, the transfer transistor 512 is connected to the source side dummy word line driver (WLDS DRV) 560, and the transfer transistor 514 is connected to the source select gate driver (SGS DRV). Each voltage driver can be independently controlled by processor 312 to provide a desired output voltage.

A similar arrangement is used for the example unselected block 520, which includes a transfer transistor 524 connected to SGD and SGD DRV 552, a transfer transistor 526 connected to WLDD and WLDD DRV 554, a transfer transistor 528 connected to WL47 and WL47 DRV 556, . . . , a transfer transistor 530 connected to WL0 and WL0 DRV 558, a transfer transistor 532 connected to WLDS and WLDS DRV 560, and a transfer transistor 534 connected to SGS and SGS DRV 562. The control gates of the transfer transistors of the unselected block 520 are connected to a respective block decoder (BD) 522 via a common path 523. The BD 522 is also connected to the TT DRV 564 to receive a voltage, and to the address register 570 to receive a control signal which instructs the BD 522 to pass or not pass the voltage to the control gates of the associated transfer transistors via path 523. The address register (ADD REG) 570 also communicates with the voltage drivers in the set of high-voltage voltage drivers 550.

A number of bit lines (BLs) 542 extend across the selected block 500 and the unselected block 520 (and across additional unselected blocks, not shown, in some implementations) and into a page buffer 540, which is responsive to a column decoder 132. The page buffers stores data which is written into, or read from, a selected word line of the selected block. During an operation of the memory device, the address register 570 provides a data load command to an input-output buffer 578 and to a command register 576. The input-output buffer 578 provides the command to the page buffer 540. The command register 576 provides a command to a control circuit 580, which instructs high voltage generator (HV GEN) 572 to control the voltage drivers 550 at appropriate levels. Typically, during programming, the driver of the selected word line provides a programming level voltage, such as 12-26 V while the unselected word lines receive a pass voltage VPASS such as 4-6 V. During sensing, the driver of the selected word line provides a read or verify level voltage ($V_{CGR}$ or $V_{VERIFY}$, respectively), while the unselected word lines receive a read pass voltage, $V_{READ-PASS}$. The control 580 also instructs the page buffer driver (PB DRV) 574 to control the page buffer 540. The address register 570 also communicates with the column decoder 132.

Figure 6:
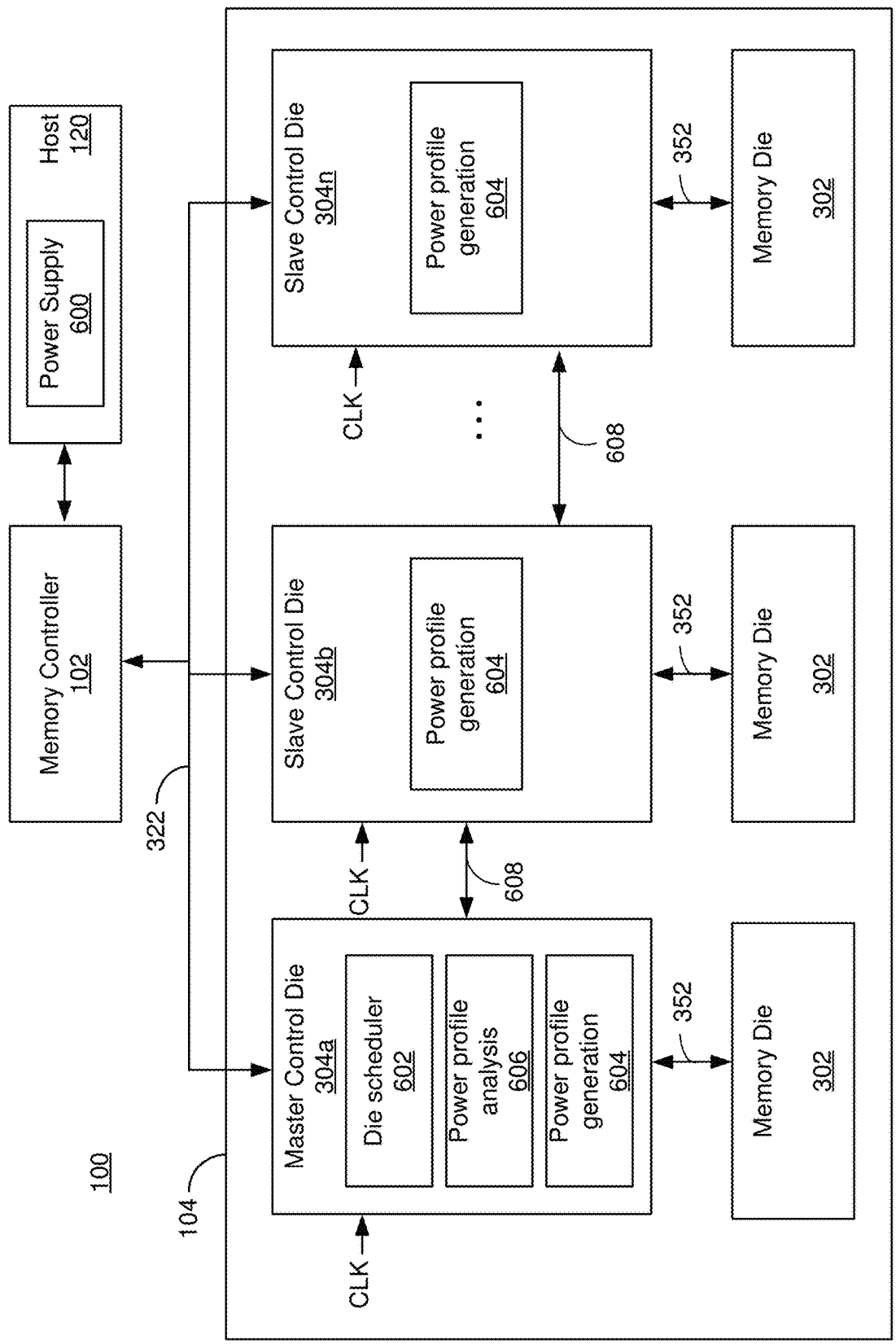
FIG. 6 is a diagram of one embodiment of a processor, connected to storage.

FIG. 6 is a diagram depicting one embodiment of memory system 100 connected to a host 120. The memory system 100 has a memory controller 102 and an integrated memory assembly 104. The memory controller 102 is connected to the integrated memory assembly 104 by the data bus 332. The data bus 332 is connected to memory controller interface 334. As noted above, memory controller interface 334 may implement a Toggle Mode Interface that connects to the Toggle Mode interfaces of memory interface 228/258 for memory controller 102. In one embodiment, the data bus 332 includes an ONFI bus. The memory controller 102 sends memory commands (e.g., read, write, erase) to each control die 304 over the data bus 332. Each control die 304 performs the memory operations in the memory die 302 that is responsible for controlling. In FIG. 6, each control die 304 is depicted as connected (and controlling) one memory die 302. However, a control die 304 could control more than one memory die 302.

The integrated memory assembly 104 has a master control die 304a, and a number of slave control dies 304b, . . . 304n. For ease of discussion, reference 304b will be used herein to refer to a slave control die, with the understanding the any control die 304 other than the master control die 304a may be a slave control die. The host 120 has a power supply 600, which provides power to the memory controller 102, as well as to the integrated memory assembly 104. In some embodiments, the power supply 600 is able to supply a substantially constant voltage, so long as the current is under a peak current. The master control die 304a manages power/current consumption in the integrated memory assembly 104.

The die scheduler logic 602 determines a memory die schedule in order to implement a power plan for the integrated memory assembly 104. The memory die schedule specifies when each memory die 302 is to perform memory operations (or phases thereof). The master control die 304a sends a memory die schedule to each slave control die 304b such that the slave control die 304b knows when it is to perform memory operations (or phases thereof). Each control die 304 has access to a common clock signal (CLK), which is used to synchronize memory operations. That is, the common clock is used to determine when (e.g., in what time period) a memory operation (or phase thereof) is to be performed.

Figure 20:
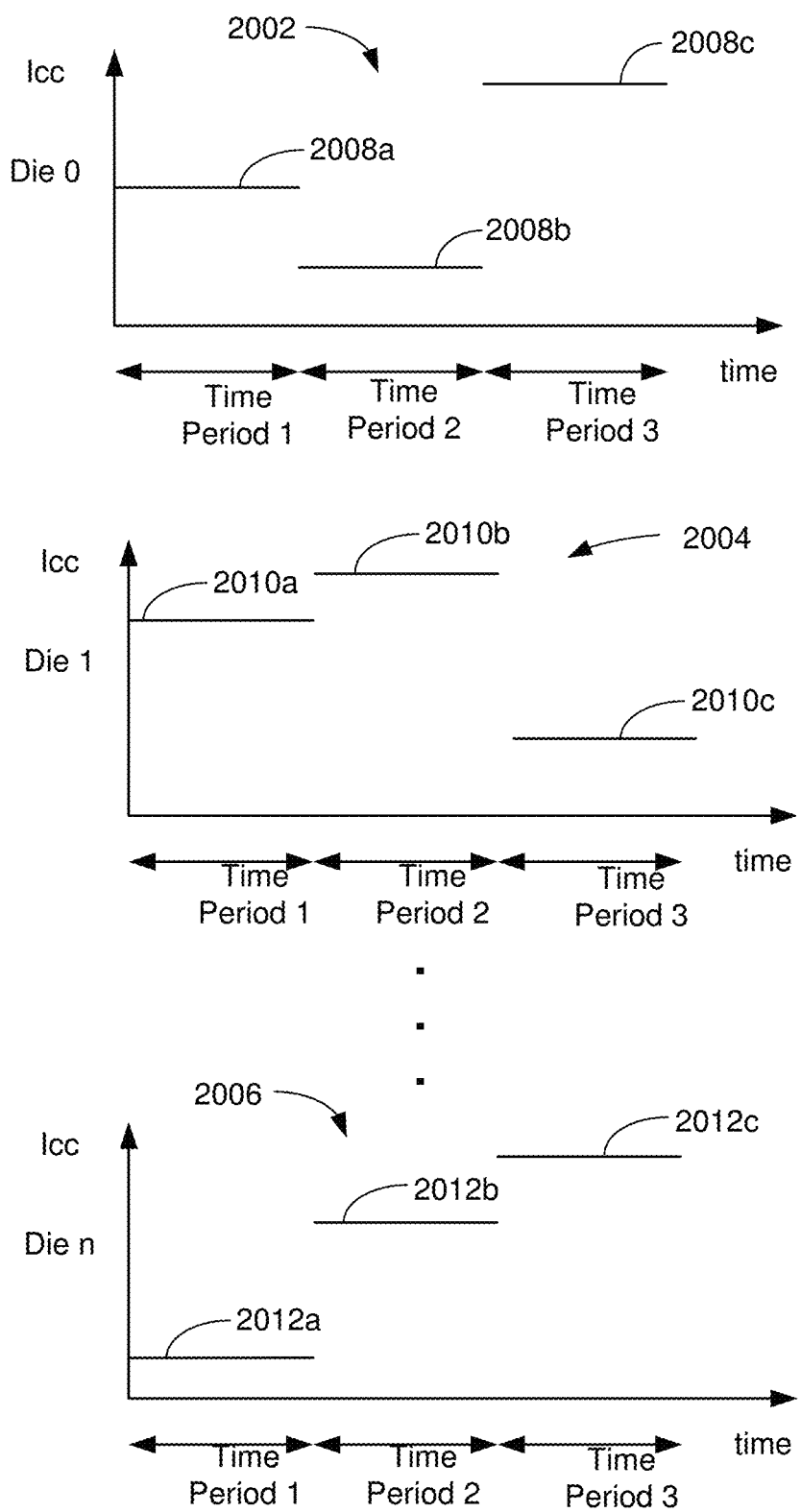
FIG. 20 depicts several plots that show example of current (e.g., Icc) usage profiles for several memory dies.

In one embodiment, each control die 304 has power profile generation logic 604, which determines upcoming power (or alternatively current) usage for a memory die 302. This power/current usage is based on upcoming memory operations to be performed in the memory die 302, as well as expected power/current consumption for those operations. There may be some variation between memory dies 302 in their power/current consumption for a particular memory operations. Hence, in some embodiments, a control die 304 will test the memory die 302 it controls to determine the power/current characteristics that are unique to that memory die 302. However, such tests are not required to be performed by the control die 304. Alternatively, the memory controller 102 could determine the power/current characteristics that are unique to each memory die 302. An example of power profiles for various memory dies 302 is depicted in FIG. 20.

The master control die 304a has power profile analysis logic 606, which analyzes the power profiles from the various memory dies 302 (as well as the memory die 302 controlled by the master control die). The memory die schedule is determined based on the power profile analysis. Note that in some embodiments, the master control die 304a determines the memory die schedule based on expected current usage for memory operations performed in the assembly 104.

In some embodiments, the master control die 304a communicates with the slave control dies 304b, . . . 304n over a communication link 608. In some embodiments, the control dies 304 have through silicon vias (TSV), and at least a portion of a communication link 608 runs through the TSVs. Communicating over the communication link 608 avoids using the data bus 332. Therefore, power management does not burden the data bus 332.

In some embodiments, the master control die 304a has a processor (e.g., microprocessor) that executes instructions in order to implement the die scheduler logic 602, the power profile generation 604, and the profile analysis logic 606. The slave control dies 304 may also have a processor to implement the power profile generation logic 604. However, it is not required that all of the aforementioned logic (e.g., 602, 604, 606) be implemented by software (i.e., by executing instructions on a processor). In various embodiments, some or all of the aforementioned logic (e.g., 602, 604, 606) described with respect to FIG. 6 is implemented in hardware, which could include, but is not limited to: a hard-wired state machine, an electrical circuit, an application specific integrated circuit (ASIC), a Field Programmable Gate Array (FPGA), a digital logic circuit, an analog circuit, gates, flip flops, latches, RAM/ROM, and/or combinational logic.

Figure 7:
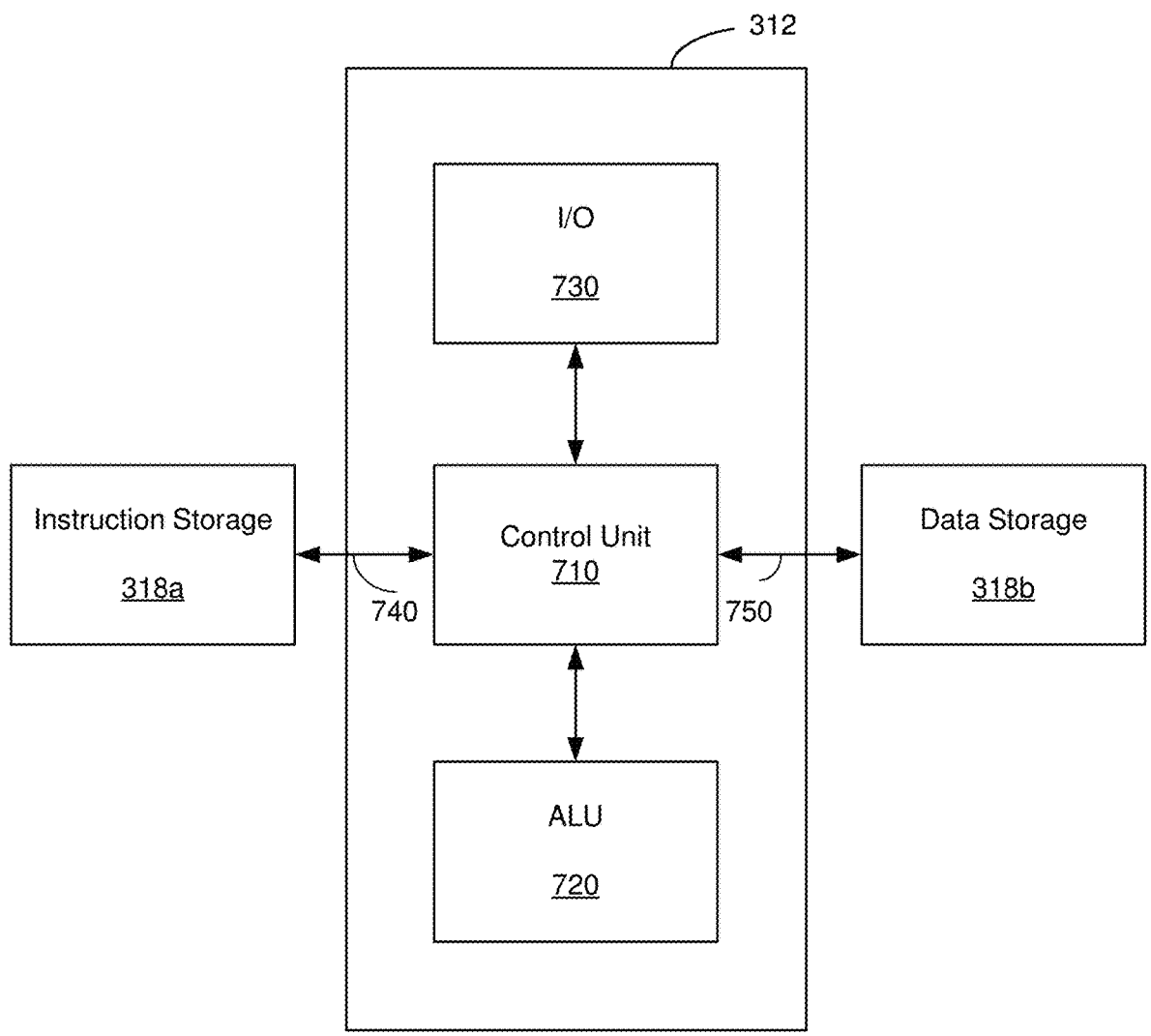
FIG. 7 is a diagram that shows various program modules that may be stored in storage region.

As noted, a control die 304 may have a processor to perform various functionality described herein. FIG. 7 is a diagram of one embodiment of a processor 312 on a control die 304. The processor 312 has a control unit 710, an arithmetic logic unit (ALU), and input/output (I/O) 730. In the embodiment in FIG. 7, the storage 318 is divided between instruction storage 318a and data storage 318b. There is one pathway 740 between the control unit 710 and the instruction storage 318a, and another pathway 750 between the control unit 710 and the data storage 318b. However, it is not required that there be a separate instruction storage 318a and data storage 318b. Also, it is not required that there be two pathways 740, 750. In one embodiment, there is a single pathway between the control unit 710 and storage 318.

In some embodiments, the control unit 710 contains an instruction register and a program counter. The program counter stores the address of a program instruction in instruction storage 318a. The control unit 710 may also contain instruction fetcher that is configured to fetch an instruction identified by the program counter from instruction storage 318a. The control unit 710 may also contain an instruction decoder that is configured to decode the instruction. The control unit 710 may also contain an instruction executer that is configured to execute the decoded instructions. The control unit 710 may also contain registers, which may be used for temporary storage of parameters.

The ALU 720 is used to perform arithmetic operations, such as determine voltage magnitudes to be applied to the memory structure 326. In one embodiment, the ALU performs arithmetic and bitwise operations on integer binary numbers. In one embodiment, the ALU 720 is a combinational digital electric circuit. For example, the ALU 720 may contain discrete logic such as AND gates, NAND gates, NOR gates, OR gates, XOR gates, etc. In some embodiments, the ALU 720 may be referred to as a processing unit.

In one embodiment, the input/output (I/O) 730 receives commands from the command interpreter 330. For example, the command interpreter 330 may send read, write (or program), erase or other commands to the I/O 730. The control unit 710 accesses and executes suitable instructions from instruction storage 318a for the command. The control unit 710 may also access various parameters and settings from the data storage 318b. The control unit 710 instructs the I/O 730 to issue control signals in order to control various circuits to effect the memory operation. The I/O 730 sends the control signals to circuits such as power control 316 and read/write circuits 328.

The processor 312 may have a wide variety of instruction set architectures. In some embodiments, the processor 312 has a RISC architecture. In one embodiment, the processor 312 has a RISC-V architecture. However, the processor 312 is not limited to a RISC architecture.

The processor 312 is programmable and reprogrammable. The processor 312 may be programmed by storing instructions into the instruction storage 318a, which are then executed in the processor 312. The processor 312 may be reprogrammed by updating, or otherwise modifying the instructions in the instruction storage 318a, which are then executed in the processor 312. In some embodiments, when the control die 304 is booted, program instructions are loaded from the memory structure storage region 336 to instruction storage 318a. Parameters and/or settings may be loaded from the memory structure storage region 336 to data storage 318b.

The elements in processor 312 may comprise, but are not limited to, one or more of a microprocessor, an electrical circuit, an application specific integrated circuit (ASIC), a Field Programmable Gate Array (FPGA), a digital logic circuit, an analog circuit, gates, flip flops, latches, RAM/ROM, and/or combinational logic.

Figure 8A:
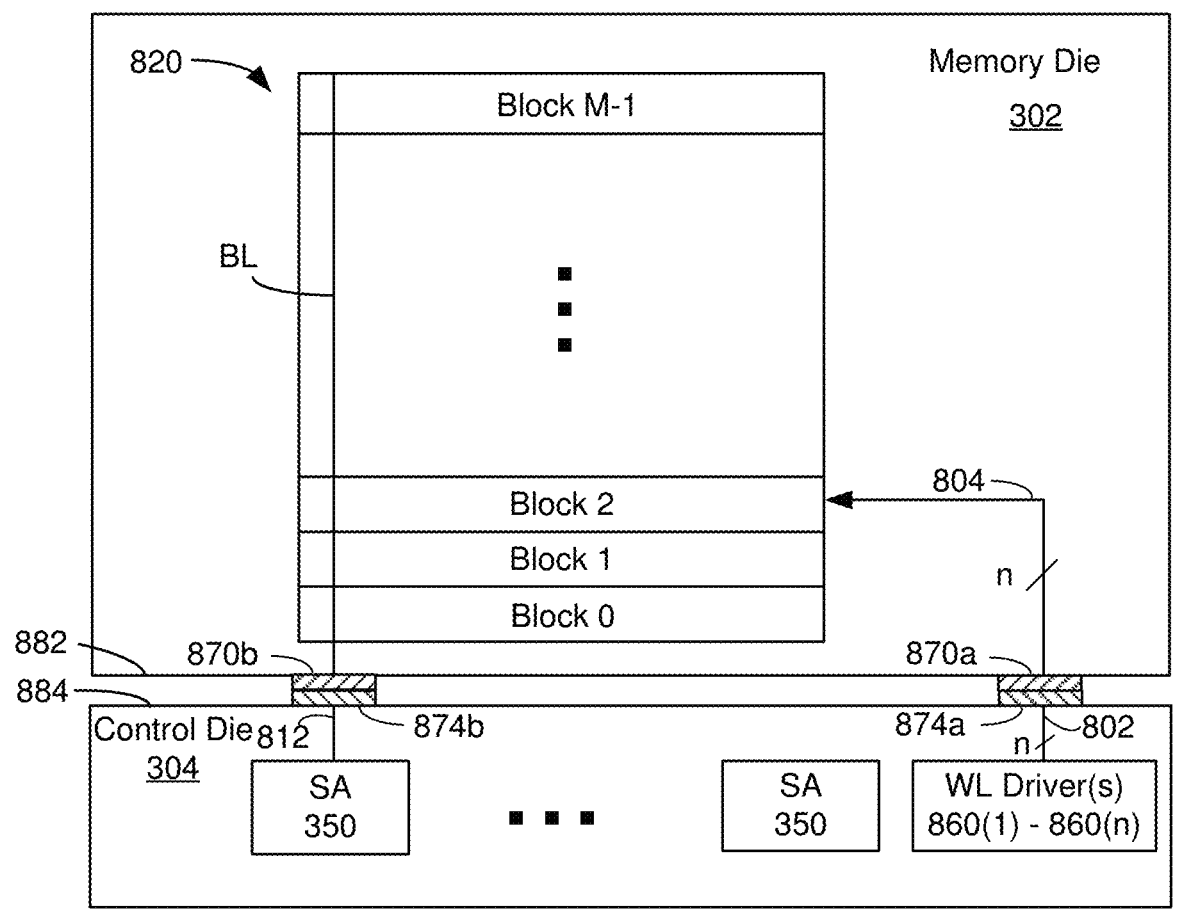
FIG. 8A is a block diagram of an embodiment of an integrated memory assembly.

FIG. 8A is a block diagram of one embodiment of an integrated memory assembly 104. FIG. 8A depicts further details of one embodiment of the integrated memory assembly 104 of FIG. 1A or 3. Memory die 302 contains a plane 820 of memory cells. The memory die 302 may have additional planes. The plane is divided into M blocks. In one example, each plane has about 1040 blocks. However, different numbers of blocks can also be used. In one embodiment, a block comprising memory cells is a unit of erase. That is, all memory cells of a block are erased together. In other embodiments, memory cells can be grouped into blocks for other reasons, such as to organize the memory structure 326 to enable the signaling and selection circuits. One representative bit line (BL) is depicted for each plane. There may be thousand or tens of thousands of such bit lines per each plane. Each block may be divided into a number of word lines, as will be described more fully below. In one embodiment, a block represents a groups of connected memory cells as the memory cells of a block share a common set of unbroken word lines and unbroken bit lines. In the structure of FIG. 8A, Block 0 and Block M−1 of plane 820 are at the edges of the memory structure (or otherwise referred to as being located in an edge region/section of the memory structure).

In one embodiment, the control die 304 includes a number of sense amplifiers (SA) 350. In an alternative embodiment, the sense amplifiers (SA) 350 reside on the memory die 302. The processor 312 controls the sense amplifiers 350 (whether on the control die 304 or memory die 302). By updating the instructions and/or parameters used by the processor 312 the operation of the sense amplifier 350 can be modified. Each sense amplifier 350 is connected to one bit line, in this example. The sense amplifier contains a bit line driver, in one embodiment. Thus, the sense amplifier may provide a voltage to the bit line to which it is connected. The sense amplifier is configured to sense a condition of the bit line. In one embodiment, the sense amplifier is configured to sense a current that flows in the bit line. In one embodiment, the sense amplifier is configured to sense a voltage on the bit line.

The control die 304 includes a number of word line drivers 860(1)-860(n). The word line drivers 860 are configured to provide voltages to word lines. In this example, there are "n" word lines per block of memory cells. In one embodiment, one of the blocks in the plane 820 is selected at a time for a memory array operation. If the memory operation is a program or read, one word line within the selected block is selected for the memory operation, in one embodiment. If the memory operation is an erase, all of the word lines within the selected block are selected for the erase, in one embodiment. The word line drivers 860 provide voltages to the word lines in a first selected block (e.g., Block 2) in memory die 302. The control die 304 may also include charge pumps, voltage generators, and the like, which may be used to provide voltages for the word line drivers 860 and/or the bit line drivers.

The memory die 302 has a number of bond pads 870a, 870b on a first major surface 882 of memory die 302. There may be "n" bond pads 870a, to receive voltages from a corresponding "n" word line drivers 860(1)-860(n). There may be one bond pad 870b for each bit line associated with plane 820. The reference numeral 870 will be used to refer in general to bond pads on major surface 882.

In some embodiments, each data bit and each parity bit of a codeword are transferred through a different bond pad pair 870b, 874b. The bits of the codeword may be transferred in parallel over the bond pad pairs 870b, 874b. This provides for a very efficient data transfer relative to, for example, transferring data between the memory controller 102 and the integrated memory assembly 104. For example, the data bus between the memory controller 102 and the integrated memory assembly 104 may, for example, provide for eight, sixteen, or perhaps 32 bits to be transferred in parallel. However, the data bus between the memory controller 102 and the integrated memory assembly 104 is not limited to these examples.

The control die 304 has a number of bond pads 874a, 874b on a first major surface 884 of control die 304. There may be "n" bond pads 874a, to deliver voltages from a corresponding "n" word line drivers 860(1)-860(n) to memory die 302a. There may be one bond pad 874b for each bit line associated with plane 820. The reference numeral 874 will be used to refer in general to bond pads on major surface 882. Note that there may be bond pad pairs 870a/874a and bond pad pairs 870b/874b. In some embodiments, bond pads 870 and/or 874 are flip-chip bond pads.

The pattern of bond pads 870 matches the pattern of bond pads 874, in one embodiment. Bond pads 870 are bonded (e.g., flip chip bonded) to bond pads 874, in one embodiment. Thus, the bond pads 870, 874 electrically and physically couple the memory die 302 to the control die 304. Also, the bond pads 870, 874 permit internal signal transfer between the memory die 302 and the control die 304. Thus, the memory die 302 and the control die 304 are bonded together. Although FIG. 8A depicts one control die 304 bonded to one memory die 302, in one embodiment, one control die 304 is bonded to two memory dies 302.

Herein, "internal signal transfer" means signal transfer between the control die 304 and the memory die 302. The internal signal transfer permits the circuitry on the control die 304 to control memory operations in the memory die 302. Therefore, the bond pads 870, 874 may be used for memory operation signal transfer. Herein, "memory operation signal transfer" refers to any signals that pertain to a memory operation in a memory die 302. A memory operation signal transfer could include, but is not limited to, providing a voltage, providing a current, receiving a voltage, receiving a current, sensing a voltage, and/or sensing a current.

The bond pads 870, 874 may be formed for example of copper, aluminum and alloys thereof. There may be a liner between the bond pads 870, 874 and the major surfaces (882, 884). The liner may be formed for example of a titanium/titanium nitride stack. The bond pads 870, 874 and liner may be applied by vapor deposition and/or plating techniques. The bond pads and liners together may have a thickness of 720 nm, though this thickness may be larger or smaller in further embodiments.

Metal interconnects and/or vias may be used to electrically connect various elements in the dies to the bond pads 870, 874. Several conductive pathways, which may be implemented with metal interconnects and/or vias are depicted. For example, a sense amplifier 350 may be electrically connected to bond pad 874b by pathway 812. There may be thousands of such sense amplifiers, pathways, and bond pads. Note that the BL does not necessarily make direct connection to bond pad 870b. The word line drivers 860 may be electrically connected to bond pads 874a by pathways 802. Note that pathways 802 may comprise a separate conductive pathway for each word line driver 860(1)-860(n). Likewise, there may be a separate bond pad 874a for each word line driver 860(1)-860(n). The word lines in block 2 of the memory die 302 may be electrically connected to bond pads 870a by pathways 804. In FIG. 8A, there are "n" pathways 804, for a corresponding "n" word lines in a block. There may be a separate pair of bond pads 870a, 874a for each pathway 804. FIG. 10A depicts further details of one embodiment of an integrated memory assembly 104 having metal interconnects and/or vias.

Figure 8B:
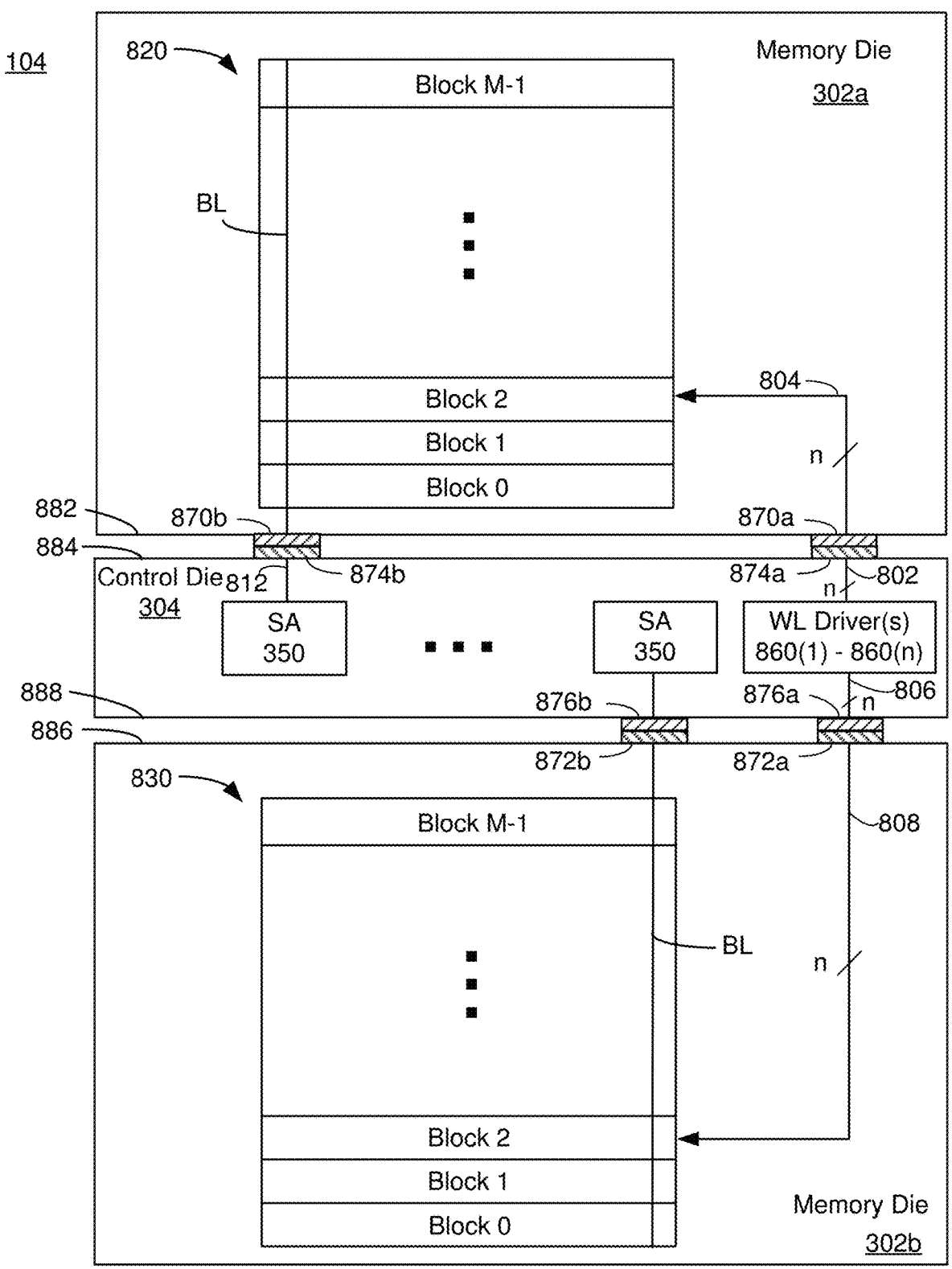
FIG. 8B is a block diagram of an embodiment of an integrated memory assembly in which a control die controls two memory dies.

FIG. 8B depicts another embodiment of an integrated memory assembly 104 in which one control die 304 may be used to control two memory die 302a, 302b. The control die 304 has a number of a number of bond pads 874(a), 874(b) on a first major surface 884, as discussed in connection with FIG. 8A. The control die 304 has a number of a number of bond pads 876(a), 876(b) on a second major surface 888. There may be "n" bond pads 876(a) to deliver voltages from a corresponding "n" word line drivers 860(1)-860(n) to memory die 302b. The word line drivers 860 may be electrically connected to bond pads 876a by pathways 806. There may be one bond pad 876b for each bit line associated with plane 830 on memory die 302b. The reference numeral 876 will be used to refer in general to bond pads on major surface 888.

The second memory die 302b has a number of bond pads 872a, 872b on a first major surface 886 of second memory die 302b. There may be "n" bond pads 872a, to receive voltages from a corresponding "n" word line drivers 860(1)-860(n). The word lines in plane 830 may be electrically connected to bond pads 872a by pathways 808. There may be one bond pad 872b for each bit line associated with plane 830. The reference numeral 872 will be used to refer in general to bond pads on major surface 886. Note that there may be bond pad pairs 872a/876a and bond pad pairs 872b/876b. In some embodiments, bond pads 872 and/or 876 are flip-chip bond pads.

In an embodiment, the "n" word line drivers 860(1)-860(n) are shared between the two memory die 302a, 302b. For example, a single word line driver may be used to provide a voltage to a word line in memory die 302a and to a word line in memory die 302b. However, it is not required that the word line drivers 860 are shared between the memory dies 302a, 302b.

Figure 9A:
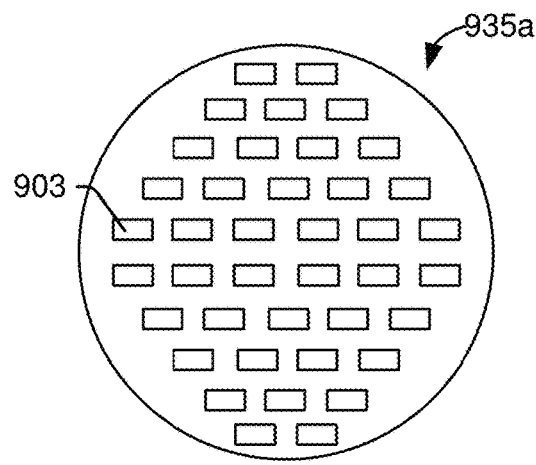
FIGS. 9A and 9B are top views of semiconductor wafers.

FIG. 9A is a top view of a semiconductor wafer 935a from which multiple control die 304 may be formed. The wafer 935a has numerous copies of integrated circuits 903. Each of the integrated circuits 903 contains the control circuitry 310 (see FIG. 3), in one embodiment. The wafer 935a is diced into semiconductor dies, each containing one of the copies of the integrated circuits 903, in some embodiments. Therefore, numerous control semiconductor dies 304 may be formed from the wafer 935a. Also note that even before the wafer 935a is diced, as the term "control semiconductor die" is used herein, each region in which an integrated circuit 903 resides may be referred to as a control semiconductor die 304.

Figure 9B:
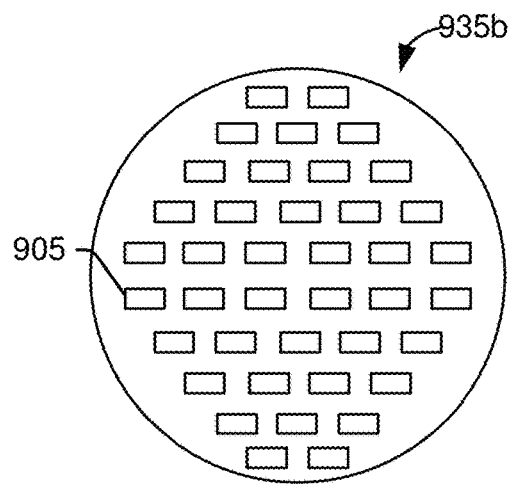

FIG. 9B is a top view of a semiconductor wafer 935b from which multiple memory die 302 may be formed. The wafer 935b has numerous copies of integrated circuits 905. Each of the integrated circuits 905 contains memory structure 326 (see FIG. 3), in one embodiment. The wafer 935b is diced into semiconductor dies, each containing one of the copies of the integrated circuits 905, in some embodiments. Therefore, numerous memory semiconductor dies 302 may be formed from the wafer 935b. Also note that even before the wafer 935b is diced, as the term "memory semiconductor die" is used herein, each region in which an integrated circuit 905 resides may be referred to as a memory semiconductor die 302.

The semiconductor wafers 935 may start as an ingot of monocrystalline silicon grown according to either a CZ, FZ or other process. The semiconductor wafers 935 may be cut and polished on major surfaces to provide smooth surfaces. The integrated circuits 903, 905 may be formed on and/or in the major surfaces. The dicing of the wafers 935 into semiconductor dies may occur before or after bonding. In one embodiment, the two wafers 935, 935b are bonded together. After bonding the two wafers together, dicing is performed. Therefore, numerous integrated memory assemblies 104 may be formed from the two wafers 935. In another embodiment, the two wafers 935a, 935b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

The dicing of the wafers 935 into semiconductor dies may occur before or after bonding. In one embodiment, the two wafers 935, 935b are bonded together. After bonding the two wafers together, dicing is performed. Therefore, numerous integrated memory assemblies 104 may be formed from the two wafers 935. In another embodiment, the two wafers 935a, 935b are diced into semiconductor dies 304, 302. Then, one of each of the semiconductor dies 304, 302 are bonded together to form an integrated memory assembly 104. Regardless of whether dicing occurs prior to or after bonding, it may be stated that the integrated memory assembly 104 contains a control semiconductor die 304, and a memory semiconductor die 302 bonded together.

Figure 10:
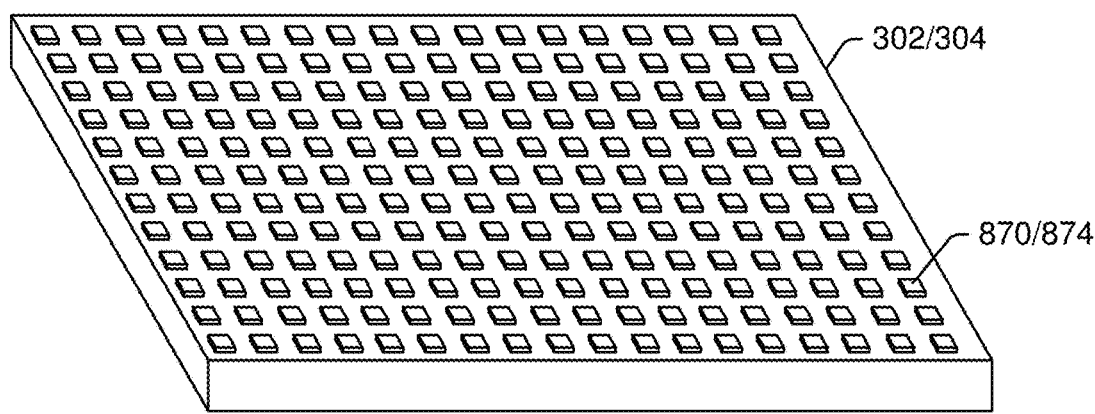
FIG. 10 depicts an example pattern of bond pads on a planar surface of a semiconductor die.

As has been briefly discussed above, the control die 304 and the memory die 302 may be bonded together. Bond pads on each die 302, 304 may be used to bond the two dies together. Recall that FIG. 8A depicts one example of bonds 870 on the memory die 302, as well as bonds 874 on the semiconductor die 304. FIG. 10 depicts an example pattern of bond pads on a planar surface of a semiconductor die. The semiconductor die could be memory die 302 or control die 304. The bond pads could be any of bond pads 870 or 874, as appropriate for the semiconductor die. There may be many more bond pads than are depicted in FIG. 10. As one example, 100,000 or more interconnections may be required between two of the semiconductor die. In order to support such large numbers of electrical interconnections, the bond pads may be provided with a small area and pitch. In some embodiments, the bond pads are flip-chip bond pads.

The semiconductor dies 302, 304 in the integrated memory assembly 104 may be bonded to each other by initially aligning the bond pads 870, 874 on the respective dies 302, 304 with each other. Thereafter, the bond pads may be bonded together by any of a variety of bonding techniques, depending in part on bond pad size and bond pad spacing (i.e., bond pad pitch). The bond pad size and pitch may in turn be dictated by the number of electrical interconnections required between the first and second semiconductor dies 302 and 304.

In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 302, 304. Where no such film is initially provided, a space between the dies may be under filled with an epoxy or other resin or polymer. The under-fill material may be applied as a liquid which then hardens into a solid layer. This under-fill step protects the electrical connections between the dies 302, 304, and further secures the dies together. Various materials may be used as under-fill material, but in embodiments, it may be Hysol epoxy resin from Henkel Corp., having offices in California, USA.

Figure 11A:
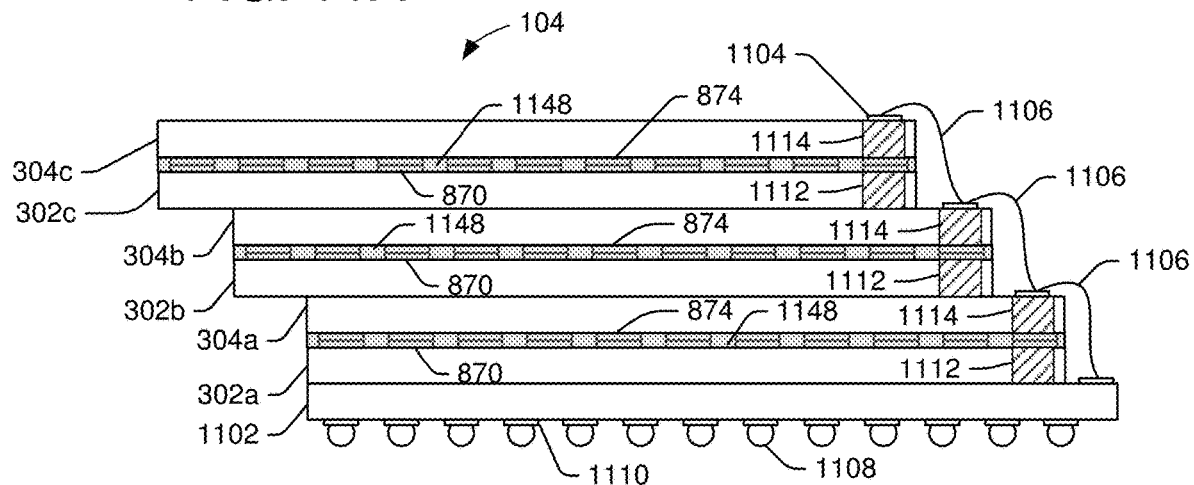
FIG. 11A depicts a side view of an embodiment of an integrated memory assembly stacked on a substrate.

In some embodiments, there is more than one control die 304 and more than one memory die 302 in an integrated memory assembly 104. In some embodiments, the integrated memory assembly 104 includes a stack of multiple control die 304 and multiple memory die 302. FIG. 11A depicts a side view of an embodiment of an integrated memory assembly 104 stacked on a substrate 1102 (e.g., a stack comprising control dies 304 and memory dies 302). The integrated memory assembly 104 has three control die 304a, 304b, 304c and three memory die 302a, 302b, 302c. In some embodiments, there are many more than three memory die 302 and many more than three control die 304. In one embodiment, one of the control die (e.g., 302a) is a master control die. In some embodiments, the master control die determines a memory die 302 schedule in order to implement a power/current plan for the integrated memory assembly 104

Each control die 304 is affixed (e.g., bonded) to at least one of the memory die 302. Some of the bond pads 870, 874, are depicted. There may be many more bond pads. A space between two dies 302, 304 that are bonded together is filled with a solid layer 1148, which may be formed from epoxy or other resin or polymer. This solid layer 1148 protects the electrical connections between the dies 302, 304, and further secures the dies together. Various materials may be used as solid layer 1148, but in embodiments, it may be Hysol epoxy resin from Henkel Corp., having offices in California, USA.

The integrated memory assembly 104 may for example be stacked with a stepped offset, leaving the bond pads 1104 at each level uncovered and accessible from above. Wire bonds 1106 connected to the bond pads 1104 connect the control die 304 to the substrate 1102. A number of such wire bonds may be formed across the width of each control die 304 (i.e., into the page of FIG. 11A).

A memory die through silicon via (TSV) 1112 may be used to route signals through a memory die 304. A control die through silicon via (TSV) 1114 may be used to route signals through a control die 302. In some embodiments, the master control die (e.g., 304a) communicates with slave control die (e.g., 304b, 304c) by a communication link 608. In some embodiments, at least a portion of the communication link 608 extends through one or more memory die TSV 1112 and one or more control die TSV 1114.

The TSVs 1112, 1114 may be formed before, during or after formation of the integrated circuits in the semiconductor dies 302, 304. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 1108 may optionally be affixed to contact pads 1110 on a lower surface of substrate 1102. The solder balls 1108 may be used to electrically and mechanically couple the integrated memory assembly 104 to a host device such as a printed circuit board. Solder balls 1108 may be omitted where the integrated memory assembly 104 is to be used as an LGA package. The solder balls 1108 may form a part of the interface between the integrated memory assembly 104 and the memory controller 102.

Figure 11B:
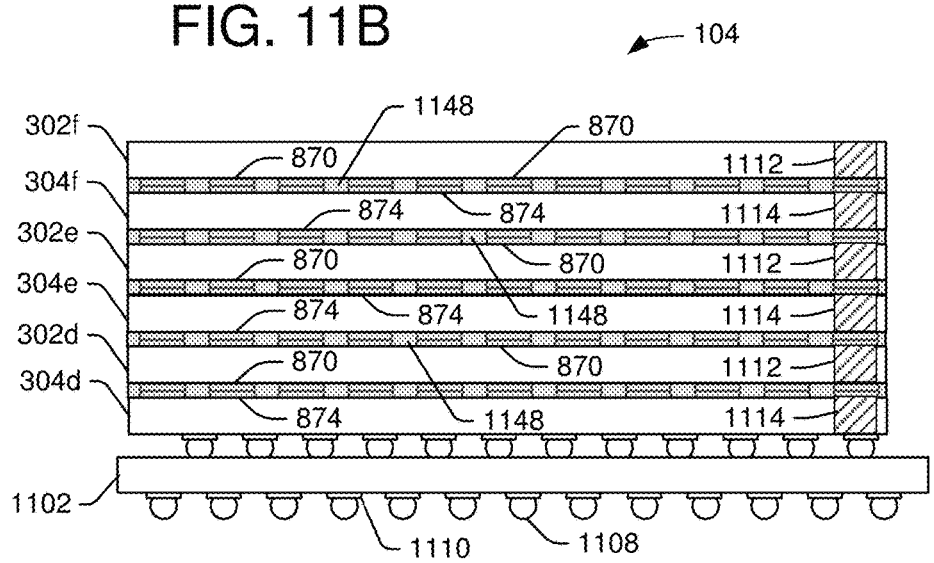
FIG. 11B depicts a side view of an embodiment of an integrated memory assembly stacked on a substrate.

FIG. 11B depicts a side view of an embodiment of an integrated memory assembly 104 stacked on a substrate 1102. The integrated memory assembly 104 has three control die 304d, 304e, 304f and three memory die 302d, 302e, 302f. In some embodiments, there are many more than three memory die 302 and many more than three control die 304. In one embodiment, one of the control die (e.g., 302d) is a master control die. In some embodiments, the master control die determines a memory die 302 schedule in order to implement a power/current plan for the integrated memory assembly 104. In this example, each control die 304 is bonded to at least one memory die 302. Optionally, a control die 304 may be bonded to two memory die 302. For example, control die 304e is bonded to both memory die 302d and 304e. Likewise, control die 304f is bonded to both memory die 302e and 304f.

Some of the bond pads 870, 874 are depicted. There may be many more bond pads. A space between two dies 302, 304 that are bonded together is filled with a solid layer 1148, which may be formed from epoxy or other resin or polymer. In contrast to the example in FIG. 11A, the integrated memory assembly 104 in FIG. 11B does not have a stepped offset. A memory die through silicon via (TSV) 1112 may be used to route signals through a memory die 302. A control die through silicon via (TSV) 1114 may be used to route signals through a control die 304.

Solder balls 1108 may optionally be affixed to contact pads 1110 on a lower surface of substrate 1102. The solder balls 1108 may be used to electrically and mechanically couple the integrated memory assembly 104 to a host device such as a printed circuit board. Solder balls 1108 may be omitted where the integrated memory assembly 104 is to be used as an LGA package.

Figure 12:
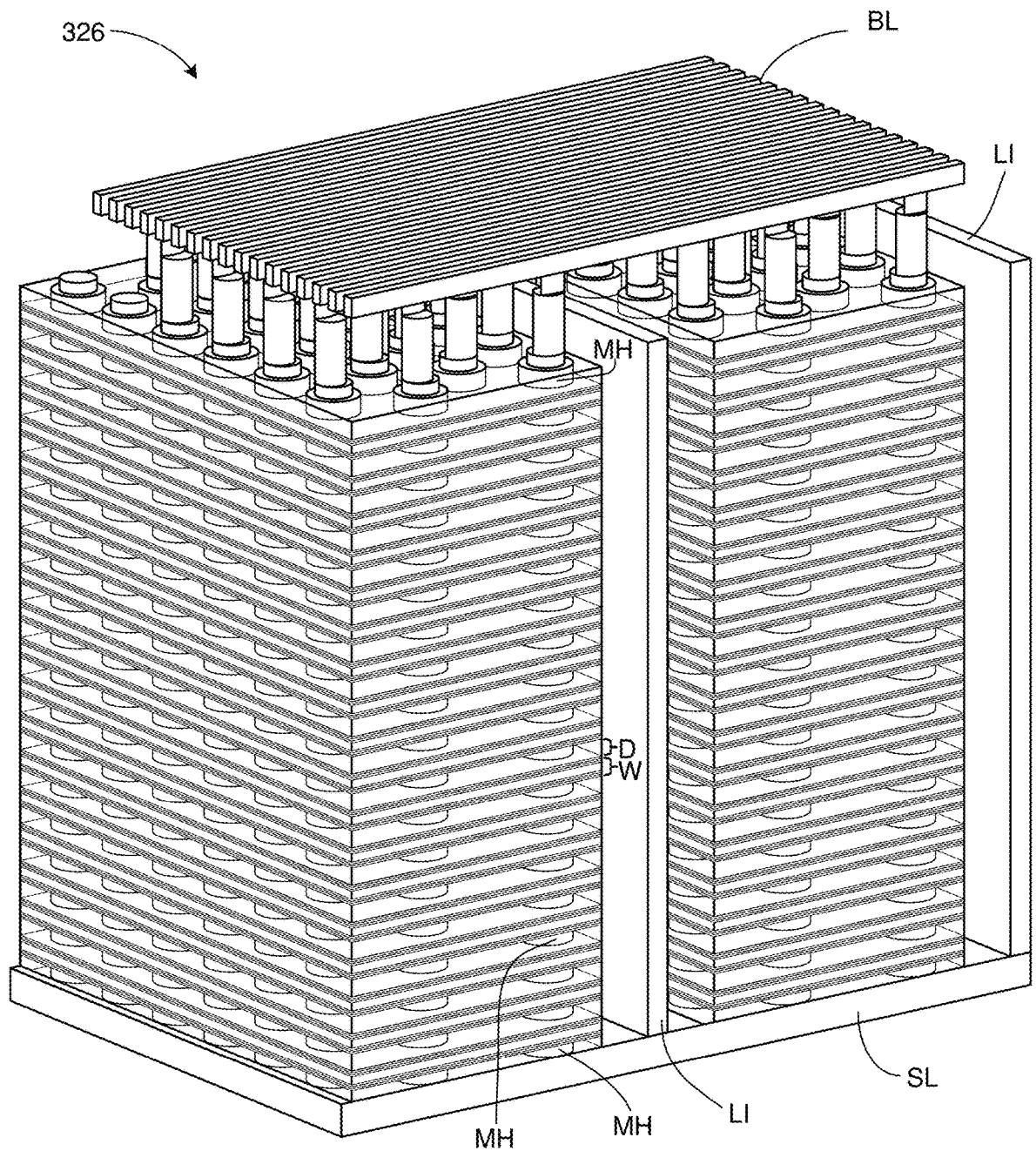
FIG. 12 is a perspective view of a portion of one example embodiment of a monolithic three dimensional memory array that can comprise memory structure.

FIG. 12 is a perspective view of a portion of one example embodiment of a monolithic three dimensional memory array that can comprise memory structure 326, which includes a plurality non-volatile memory cells. For example, FIG. 12 shows a portion of one block comprising memory. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-304 alternating dielectric layers and conductive layers. One example embodiment includes 96 data word line layers, 8 select layers, 6 dummy word line layers and 110 dielectric layers. More or fewer than 108-304 layers can also be used. The alternating dielectric layers and conductive layers are divided into four "fingers" or sub-blocks by local interconnects LI, in an embodiment. FIG. 9 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 9, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 13A:
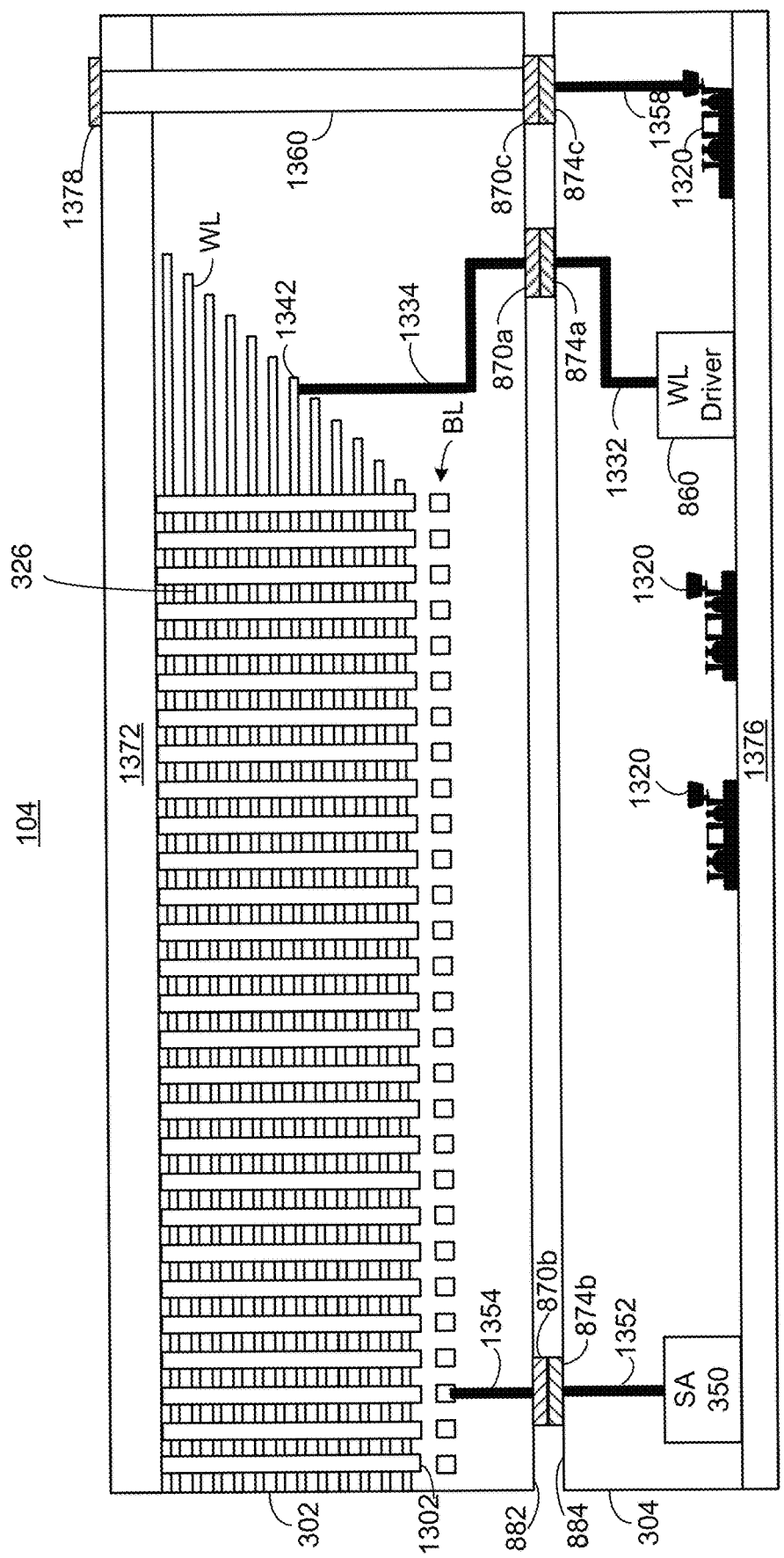
FIG. 13A is a diagram of one embodiment of an integrated memory assembly.

FIG. 13A is a diagram of one embodiment of an integrated memory assembly 104. In an embodiment depicted in FIG. 13A, memory die 302 is bonded to control die 304. This bonding configuration is similar to an embodiment depicted in FIG. 8A. Note that although a gap is depicted between the pairs of adjacent dies, such a gap may be filled with an epoxy or other resin or polymer. FIG. 13A shows additional details of one embodiment of pathways 352.

The memory die includes a memory structure 326. Memory structure 326 is adjacent to substrate 1372 of memory die 302. The substrate 1372 is formed from a portion of a silicon wafer, in some embodiments. In this example, the memory structure 326 include a three-dimensional memory array. The memory structure 326 has a similar structure as the example depicted in FIG. 12. There are a number of word line layers (WL), which are separated by dielectric layers. The dielectric layers are represented by gaps between the word line layers. Thus, the word line layers and dielectric layers form a stack. There may be many more word line layers than are depicted in FIG. 13A. As with the example of FIG. 12, there are a number of columns that extend through the stack. One column 1302 is referred to in each stack with reference numeral 1302. The columns contain memory cells. For example, each column may contain a NAND string. There are a number of bit lines (BL) adjacent to the stack.

Word line driver 860 concurrently provides voltages to a word line 1342 in memory die 302. The pathway from the word line driver 860 to the word line 1342 includes conductive pathway 1332, bond pad 874a, bond pad 870a, and conductive pathway 1334. In some embodiments, conductive pathways 1332, 1334 are referred to as a pathway pair. Conductive pathways 1332, 1334 may each include one or more vias (which may extend vertically with respect to the major surfaces of the die) and one or more metal interconnects (which may extend horizontally with respect to the major surfaces of the die). Conductive pathways 1332, 1334 may include transistors or other circuit elements. In one embodiment, the transistors may be used to, in effect, open or close the pathway. Other word line drivers (not depicted in FIG. 13A) provide voltages to other word lines. Thus, there are additional bond pad 874a, 870a in addition to bond pads 874a, 870a. As is known in the art, the bond pads may be formed for example of copper, aluminum and alloys thereof.

Sense amplifier 350 is in communication with a bit line in memory die 302. The pathway from the sense amplifier 350 to the bit line includes conductive pathway 1352, bond pad 874b, bond pad 870b, and conductive pathway 1354. In some embodiments, conductive pathways 1352, 1354 are referred to as a pathway pair. Conductive pathways 1352, 1354 may include one or more vias (which may extend vertically with respect to the major surfaces of the die) and one or more metal interconnects (which may extend horizontally with respect to the major surfaces of the die). The metal interconnects may be formed of a variety of electrically conductive metals including for example copper and copper alloys as is known in the art, and the vias may be lined and/or filled with a variety of electrically conductive metals including for example tungsten, copper and copper alloys as is known in the art. Conductive pathways 1352, 1354 may include transistors or other circuit elements. In one embodiment, the transistors may be used to, in effect, open or close the pathway.

The control die 304 has a substrate 1376, which may be formed from a silicon wafer. The sense amplifiers 350, word line driver(s) 860, and other circuitry 1320 may be formed on and/or in the substrate 1376. The circuitry 1320 may include some or all of the control circuitry 310 (see FIG. 3). In some embodiments, sense amplifiers 350, word line driver(s) 860, and/or other circuitry 1320 comprise CMOS circuits.

There is an external signal path that allows circuitry on the control die 304 to communicate with an entity external to the integrated memory assembly 104, such as memory controller 102. Therefore, circuitry 1320 on the control die 304 may communicate with, for example, memory controller 102 (see FIG. 3). Optionally, circuitry on the control die 304 may communicate with, for example, host 120. The external pathway includes via 1358 in control die 304, bond pad 874c, bond pad 870c, through silicon via (TSV) 1360, and external pad 1378. The TSV 1360 extends through substrate 1372.

The TSV 1360, may be formed before, during or after formation of the integrated circuits in the semiconductor dies 302, 304. The TSV may be formed by etching holes through the wafers. For example, holes may be etched through substrate 1372. The holes also may be etched through material adjacent to the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Numerous modifications to an embodiment depicted in FIG. 13A are possible. One modification is for sense amplifiers 350 to be located on memory die 302.

Figure 13B:
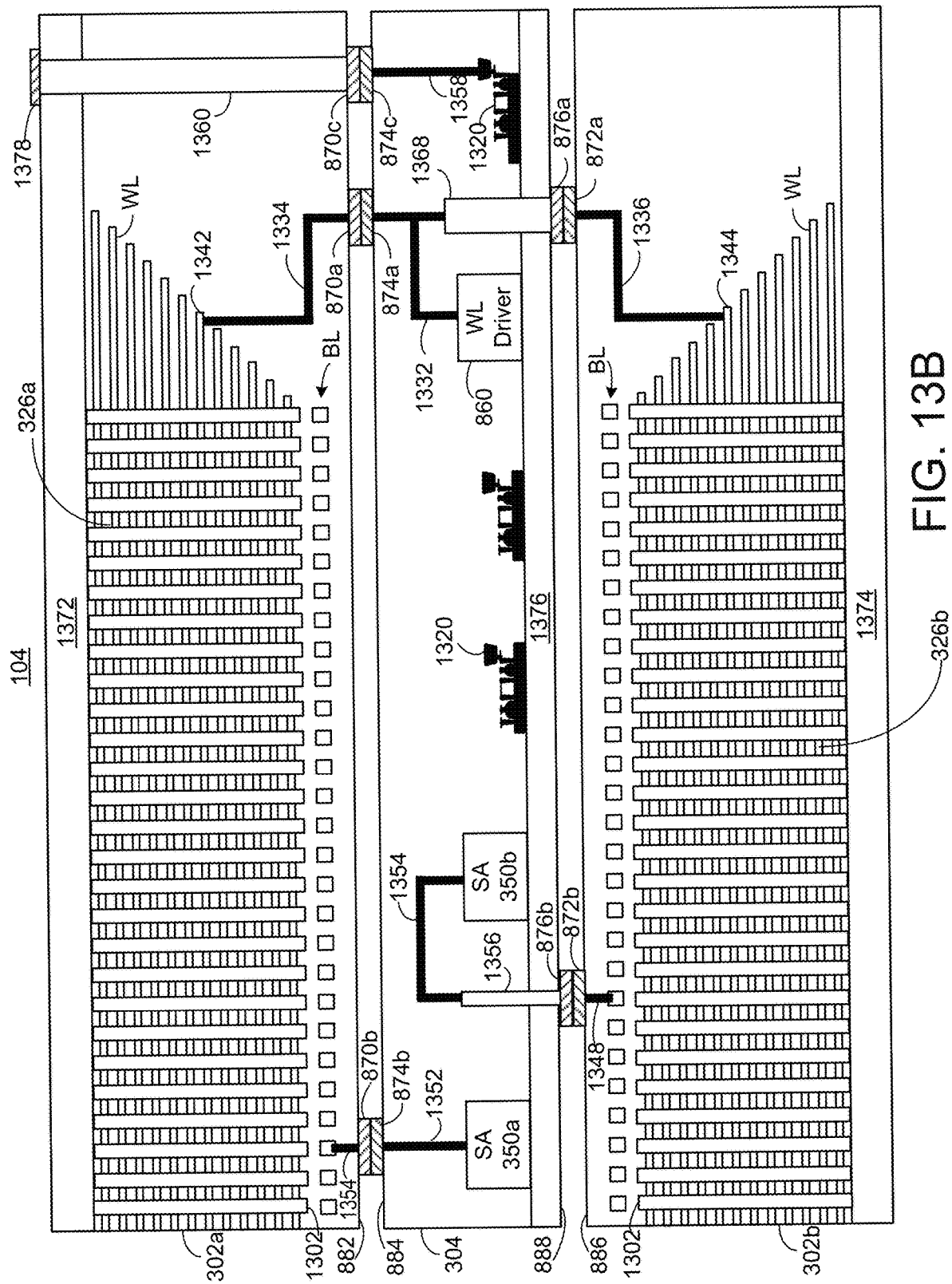
FIG. 13B is a diagram of one embodiment of an integrated memory assembly in which one control die controls two memory die.

FIG. 13B is a diagram of one embodiment of an integrated memory assembly 104. This bonding configuration is similar to an embodiment depicted in FIG. 8B. The configuration in FIG. 13B adds an extra memory die relative to the configuration in FIG. 13A. Hence, similar reference numerals are used for memory die 302a in FIG. 13B, as were used for memory die 302 in FIG. 13A. In an embodiment depicted in FIG. 13B, first memory die 302a is bonded to control die 304, and control die 304 is bonded to second memory die 302b. Note that although a gap is depicted between the pairs of adjacent dies, such a gap may be filled with an epoxy or other resin or polymer.

Each memory die 302a, 302b includes a memory structure 326. Memory structure 326a is adjacent to substrate 1372 of memory die 302a. Memory structure 326b is adjacent to substrate 1374 of memory die 302b. The substrates 1372, 1374 are formed from a portion of a silicon wafer, in some embodiments. In this example, the memory structures 326 each include a three-dimensional memory array.

Word line driver 860 concurrently provides voltages to a first word line 1342 in memory die 302a and a second word line 1344 in memory die 302b. The pathway from the word line driver 860 to the second word line 1344 includes conductive pathway 1332, through silicon via (TSV) 1368, bond pad 876a, bond pad 872a, and conductive pathway 1336. Other word line drivers (not depicted in FIG. 13B) provide voltages to other word lines.

Sense amplifier 350a is in communication with a bit line in memory die 302a. The pathway from the sense amplifier 350a to the bit line includes conductive pathway 1352, bond pad 874b, bond pad 870b, and conductive pathway 1354. Sense amplifier 350b is in communication with a bit line in memory die 302b. The pathway from the sense amplifier 350b to the bit line includes conductive pathway 1354, TSV 1356, bond pad 876b, bond pad 872b, and conductive pathway 1348.

Numerous modification to an embodiment depicted in FIG. 13B are possible. One modification is for sense amplifiers 350a to be located on first memory die 302a, and for sense amplifiers 350b to be located on second memory die 302b.

Figure 14:
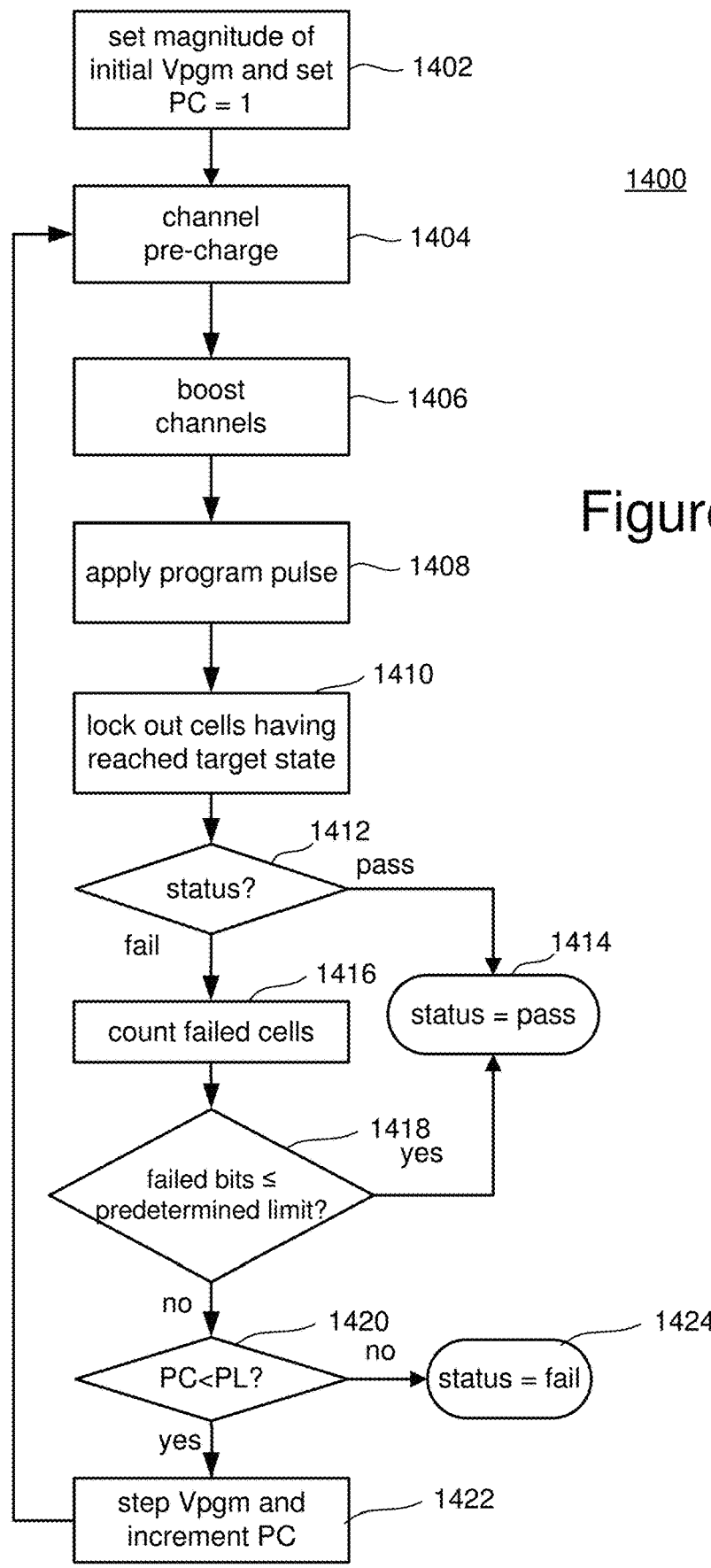
FIG. 14 is a flowchart describing one embodiment of a process for programming NAND strings of memory cells organized into an array.

FIG. 14 is a flowchart describing one embodiment of a process 1400 for programming NAND strings of memory cells organized into an array. In one example embodiment, the process of FIG. 14 is performed on integrated memory assembly 104 using the control circuitry 310 discussed above. For example, the process of FIG. 14 can be performed at the direction of processor 312. The process includes multiple loops, each of which includes a program phase (e.g., steps 1404-1408) and a verify phase (e.g., steps 1410-1418).

In many implementations, the magnitude of the program pulses is increased with each successive pulse by a predetermined step size. In step 1402 of FIG. 14, the programming voltage (Vpgm) is initialized to the starting magnitude (e.g., ~12-16V or another suitable level) and a program counter PC maintained by processor 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1404 the memory system will pre-charge channels of NAND strings that include memory cells connected to the selected word line that are to be inhibited from programming.

In step 1406, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 1408, a program pulse of the program signal Vpgm is applied to the selected word line (the word line selected for programming). If a memory cell on a NAND string should be programmed, then the corresponding bit line is biased at a program enable voltage, in one embodiment. Herein, such a NAND string is referred to as a "selected NAND string."

In step 1408, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 1410, memory cells that have reached their target states are locked out from further programming. Step 1410 may include performing verifying at one or more verify reference levels. In one embodiment, the verification process is performed by testing whether the threshold voltages of the memory cells selected for programming have reached the appropriate verify reference voltage.

In step 1410, a memory cell may be locked out after the memory cell has been verified (by a test of the Vt) that the memory cell has reached its target state.

If, in step 1412, it is determined that all of the memory cells have reached their target threshold voltages (pass), the programming process is complete and successful because all selected memory cells were programmed and verified to their target states. A status of "PASS" is reported in step 1414. Otherwise if, in step 1412, it is determined that not all of the memory cells have reached their target threshold voltages (fail), then the programming process continues to step 1416.

In step 1416, the memory system counts the number of memory cells that have not yet reached their respective target threshold voltage distribution. That is, the system counts the number of memory cells that have, so far, failed to reach their target state. This counting can be done by the processor 312, the memory controller 102, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1418, it is determined whether the count from step 1416 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1414. In this situation, enough memory cells programmed correctly such that the few remaining memory cells that have not been completely programmed can be corrected using ECC during the read process. In some embodiments, the predetermined limit used in step 1418 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1420 and the program counter PC is checked against the program limit value (PL). Examples of program limit values include 6, 12, 16, 19 and 30; however, other values can be used. If the program counter PC is not less than the program limit value PL, then the program process is considered to have failed and a status of FAIL is reported in step 1424. If the program counter PC is less than the program limit value PL, then the process continues at step 1422 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1422, the process loops back to step 1404 and another program pulse is applied to the selected word line so that another iteration (steps 1404-1422) of the programming process of FIG. 14 is performed.

In some embodiments, a control die 304 determines how much power or current will be drawn by its memory die 302 for upcoming time periods, based on how much power/current will be drawn in the various steps in process 1400. A time period could cover multiple steps of process 1400. In some embodiments, the master control die 304a selects which memory dies 304 are to perform a memory operation during a time period. In some embodiments, this may result in the control die 302 temporarily suspending the process 1400. For example, the process 1400 may be temporarily suspended between step 1408 and 1410 (i.e., between a program phase and a verify phase). The process 1400 may be temporarily suspended between a verify phase and the next program phase (e.g., prior to step 1404). In some embodiments, some of the steps in process 1400 are considered an atomic operation, which should not be halted once in progress. In one embodiment, steps 1404-1406 are performed as an atomic operation. That is, after step 1404 is started, operation is not suspended until step 1408 is complete. In some embodiments, being able to halt operations during process 1400 allows for fine grained control of power/current usage in the integrated memory assembly 104. Such fine grained control may be impossible or at least impractical if the memory controller 102 were to regulate the power usage.

Figure 15A:
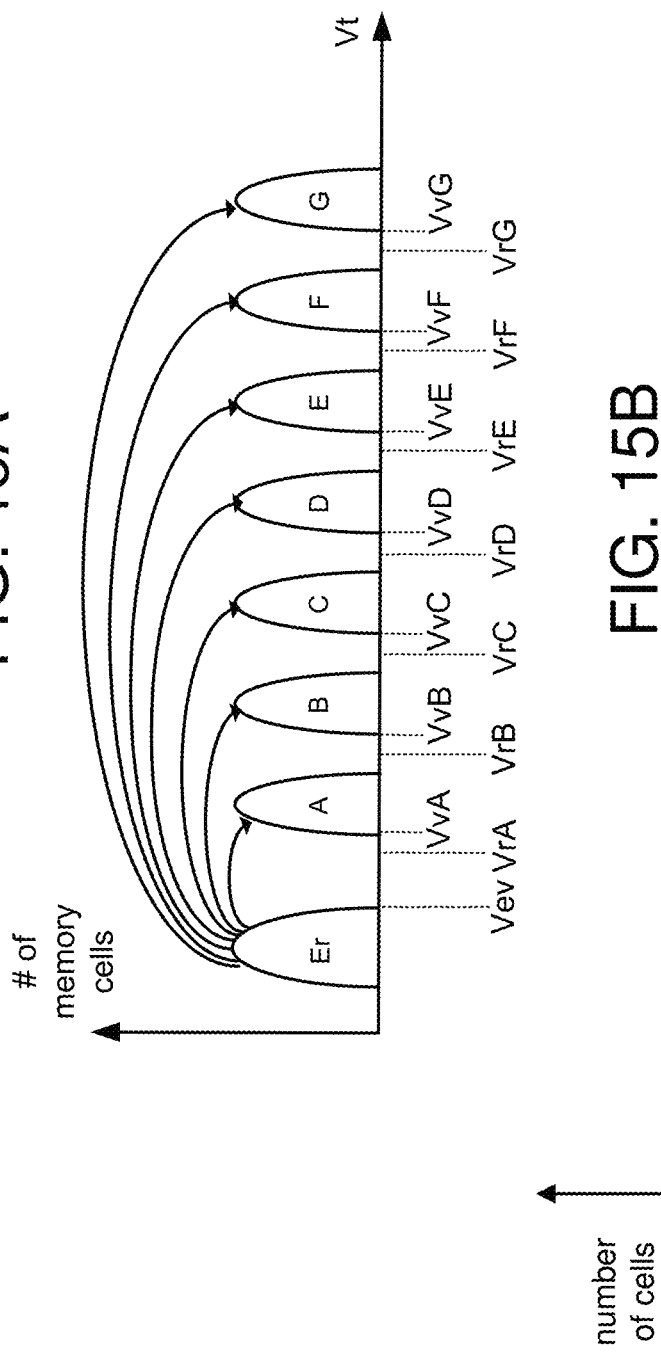
FIG. 15A illustrates example threshold voltage distributions for the memory array when each memory cell stores three bits of data.

At the end of a successful programming process, the threshold voltages of the memory cells should be within one or more distributions of threshold voltages for programmed memory cells or within a distribution of threshold voltages for erased memory cells, as appropriate. FIG. 15A illustrates example threshold voltage distributions for the memory array when each memory cell stores three bits of data. Other embodiments, however, may use other data capacities per memory cell (e.g., such as one, two, four, or five bits of data per memory cell). FIG. 15A shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 15A shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 15A also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 15A also shows Vev, which is a voltage level to test whether a memory cell has been properly erased.

In one embodiment, known as full sequence programming, memory cells can be programmed from the erased data state Er directly to any of the programmed data states A-G. For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state Er to data state B and/or from data state Er to data state C, and so on. The arrows of FIG. 15A represent the full sequence programming. In some embodiments, data states A-G can overlap, with control die 304 and/or memory controller 102 relying on error correction to identify the correct data being stored.

The technology described herein can also be used with other types of programming in addition to full sequence programming (including, but not limited to, multiple stage/phase programming). In one embodiment of multiple stage/phase programming, all memory cells to end up in any of data states D-G are programmed to an intermediate state that is no higher than D in a first phase. Memory cells to end up in any of data states Er-C do not receive programming in the first phase. In a second phase, memory cells to end up in either data state B or C are programmed to a state that is no higher than B; memory cells to end up in either data state F or G are programmed to a state that is no higher than F. In at third phase, the memory cells are programmed to their final states. In one embodiment, a first page is programmed in the first phase, a second page is programmed in the second phase, and a third page is programmed in the third phase. Herein, once on page has been programmed into a group of memory cells, the memory cells can be read back to retrieve the page. Hence, the intermediate states associated with multi-phase programming are considered herein to be programmed states.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 15A) or verify operation (e.g. see verify target levels VvA, VvB, VvC, VvD, VvE, VvF, and VvG of FIG. 15A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 15B:
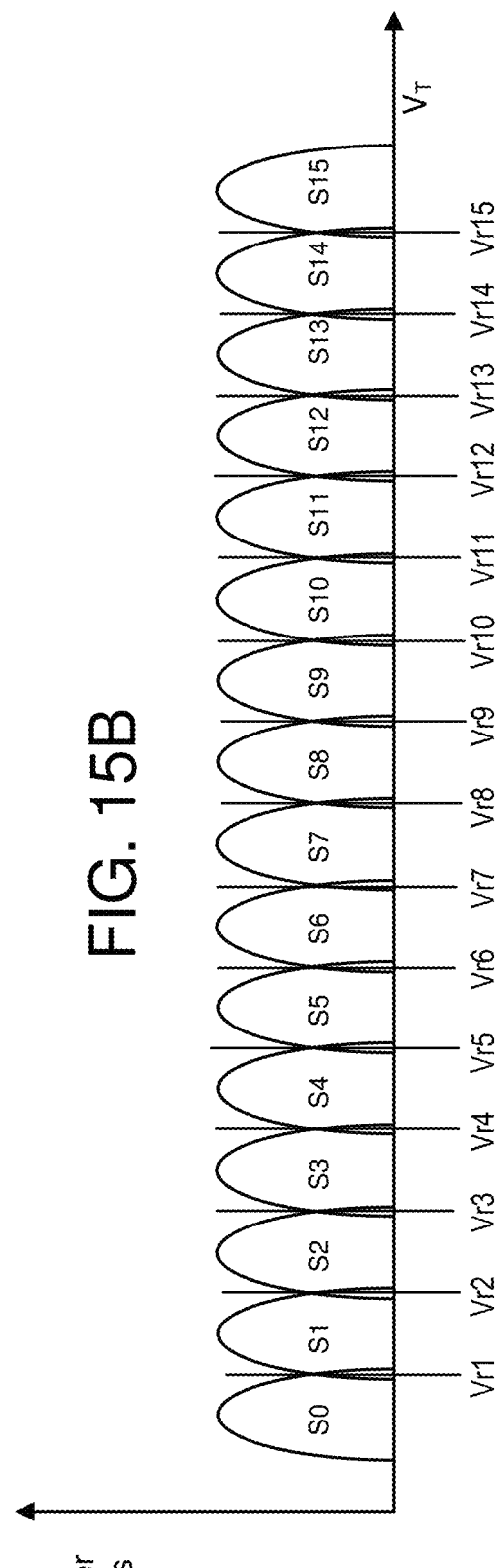
FIG. 15B depicts threshold voltage distributions in which each memory cell stores four bits of data.

FIG. 15B depicts threshold voltage distributions and one page mapping scheme when each memory cell stores four bits of data. FIG. 15B depicts that there may be some overlap between the data states S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible.

As noted, FIG. 15B depicts an example in which four bits are stored per memory cell. Thus, four pages may be stored in a set of memory cells. Fifteen read reference levels are depicted (Vr1-Vr15). The set of memory cells may be connected to the same word line.

Figure 16:
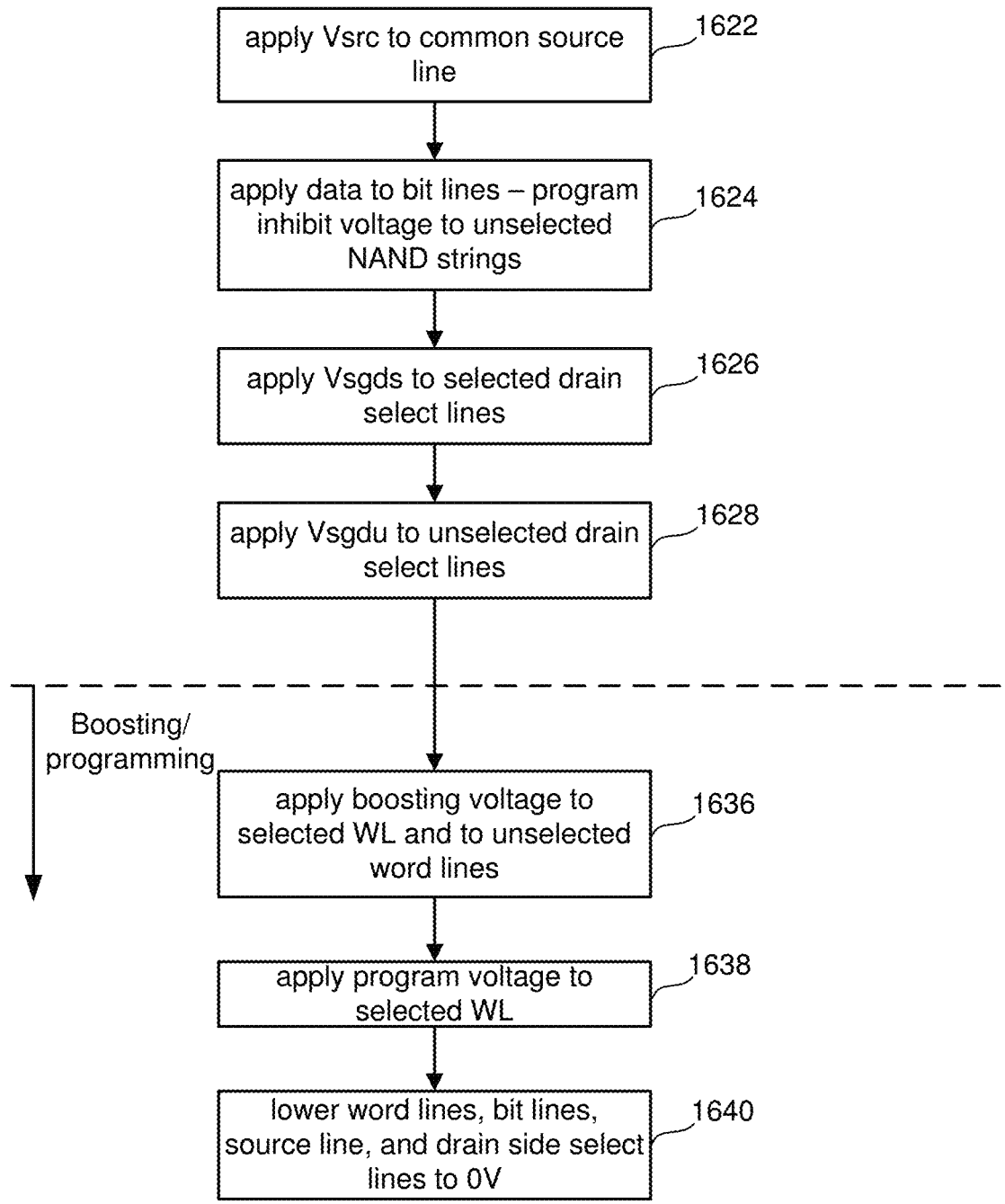
FIG. 16 depicts a flowchart of one embodiment of applying a program pulse and programming voltages that may be used in step 1408 of FIG. 14.
Figure 17:
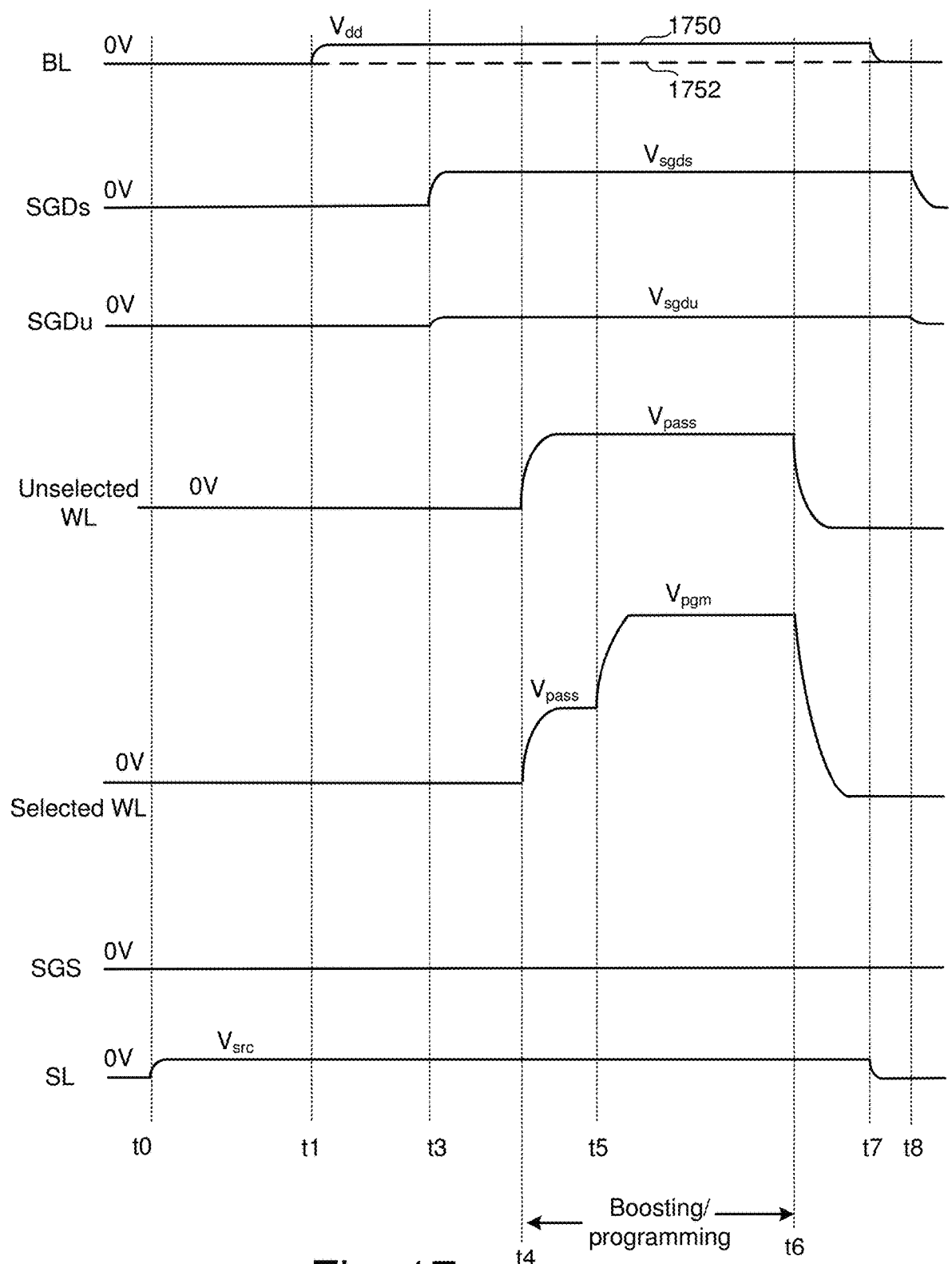
FIG. 17 shows timing of various signals during one embodiment of the process of FIG. 16.

FIGS. 16 and 17 depict further details of one embodiment of a programming phase of a programming operation. FIG. 16 depicts a flowchart of one embodiment of applying a program pulse and programming voltages that may be used in step 1408 of FIG. 14. This process is used to program 3D NAND in one embodiment. FIG. 17 shows timing of various signals during one embodiment of the process of FIG. 16. The processor 312 controls the timing and magnitudes of the signals in FIG. 17, in one embodiment.

A low voltage is applied to the source line at step 1622. Referring to FIG. 17, the common source line SL is raised to a low voltage Vsrc (e.g., about 1.0V-1.5V) at time t0 where it remains for the duration of the programming phase. The source line SL is kept at 0V in some embodiments. The source select line SGS remains at 0V to place the source select transistors into isolation mode. As one example this could be on the order of 1.0V-1.5V. Note that the other signals in FIG. 17 are at 0V at time t0.

At step 1624, the data is applied to the bit lines. In one embodiment, the processor 312 controls the sense amplifiers 350 to apply the data to the bit lines. The data may be applied to the bit lines based on whether a memory cell in the NAND strings that are in the present programming phase is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Referring to FIG. 17, line 1752 shows the bit line voltage at 0V for a NAND string (in the set that are a part of the present programming phase) having a memory cell at the selected word line WLn that is to be programmed. Line 1750 shows the bit line voltage at $V_{DD}$ for a NAND string (in the set that are a part of the present programming phase) having a cell at WLn that is to be inhibited from programming. $V_{DD}$ designates program inhibit and is often referred to as a program inhibit voltage. Note that line 1752 represents one example of V_Program_Enable, and that line 1750 represents one example of Vbl_Inhibit.

Step 1626 is to apply Vsgds to selected drain side select lines. Step 1628 is to apply Vsgdu to unselected drain side select lines. Note that FIG. 17 shows two SGD lines. Line SGDs refers to a drain side select line having at least one NAND string that is currently programming. Line SGDu refers to a drain side select line having no NAND strings currently programming.

Referring to FIG. 17, at time $t_3$, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time $t_3$.

Note that at this time Vsgds may also be applied to control gates of drain side select transistors of NAND strings for which no memory cell should be programmed. However, note that Vbl_Inhibit is being applied to the unselected bit line BL1 at time $t_3$.

Referring again to FIG. 17, at time $t_3$, drain side select line SGDu is set to Vsgdu. The voltage Vsgdu should keep off the associated drain side select transistor.

At step 1636, a boosting voltage (e.g., VAss) is applied to unselected word lines. Note that the magnitude for VpAss does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 17, at time $t_4$, the boosting/programming begins. The boosting voltages are applied to the various word lines at time $t_4$. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program phase of a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 1638. With the boosting voltages applied and the inhibited NAND string channels boosted, program disturb of unselected memory cells on the selected word line is prevented or reduced.

Referring to FIG. 17, at time $t_5$, the program voltage $V_PG_M$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 1640, the word lines, bit lines, source lines, and drain select lines are lowered to 0V, marking the completion of one programming iteration (e.g., one program phase). It should be noted that the steps of FIG. 16 can be applied with each iteration of the process of FIG. 14, with the program voltage being increased each iteration. However, it is not required that the program voltage increase in magnitude with each iteration.

Referring to FIG. 17, at time $t_6$, the word lines are lowered to 0V. The source and bit lines are then lowered to 0V at time $t_7$. The drain select line SGD is lowered to 0V at time $t_8$.

Figure 18:
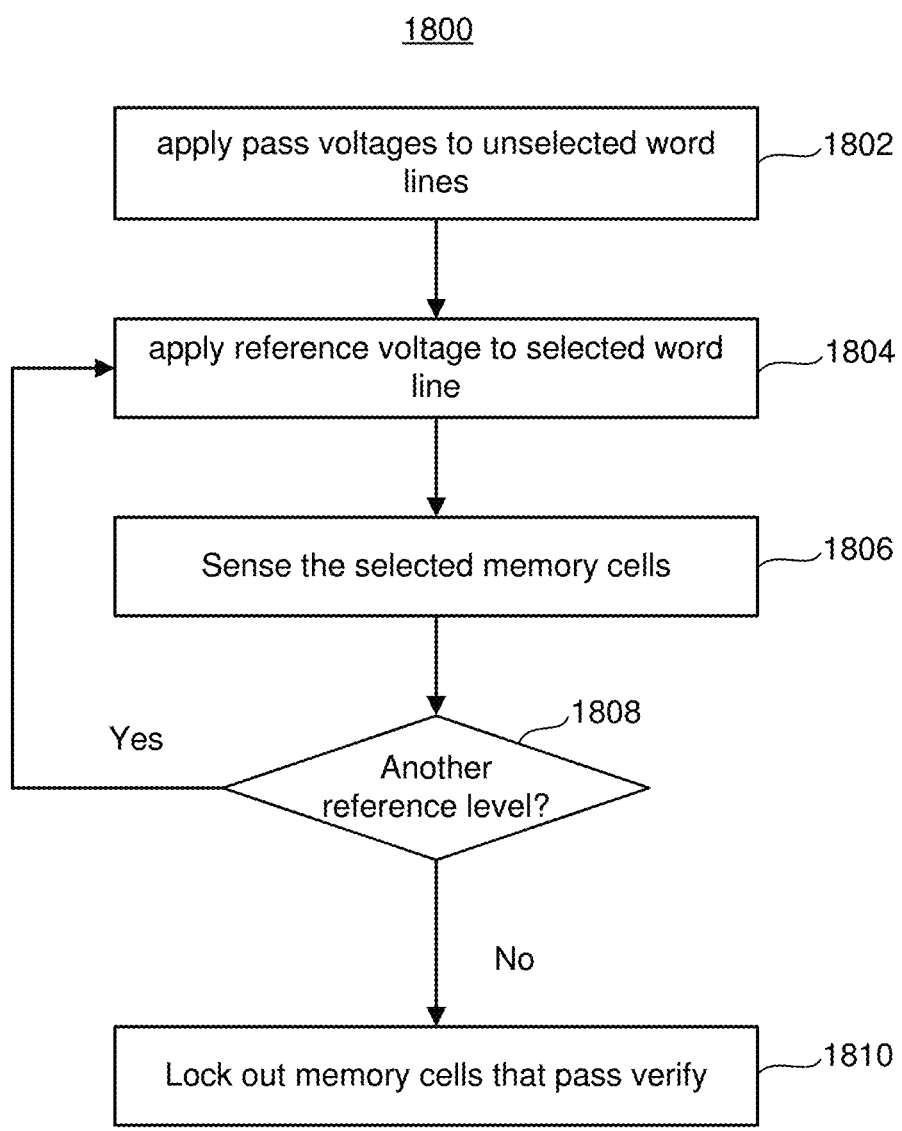
FIG. 18 depicts a flowchart describing a verify operation performed to verify whether a memory cells has been programmed to its target data state.

FIG. 18 depicts a flowchart describing an embodiment of a verify phase of a program operation performed to verify whether a memory cells has been programmed to its target data state. The process may be performed under control of the processor 312. The process 1800 can be used during step 1410 of process 1400.

In step 1802, a pass voltage is applied to unselected word lines so that unselected memory cells on a NAND string are conducting, which enables the system to test whether the selected memory cell conducts in response to the verify reference voltage. This pass voltage is often referred to as Vread. In step 1804, the appropriate verify reference voltage, also referred to as Vcgr, is applied to the selected word line (e.g., VvA, VvB, etc.).

Step 1806 includes sensing the selected memory cells. In one embodiment, the trip latch 468 in the sense amplifier 350 connected to the bit line for one of the selected memory cells may trip in response to the reference voltage applied to the selected word line. A corresponding output will be provided from the sense amplifier 350 to the latch manager 482 by way of the data bus 454. In one embodiment, the processor 312 is notified when the memory cell trips.

In some embodiments, sensing in step 1806 includes the following. In one example embodiment, a capacitor in the sense amplifier is charged up. The bit line is connected to the capacitor to allow the bit line to discharge the capacitor in response to the reference voltage in step 1804. After a predetermined time period, referred to as the "integration time" or "strobe time" the voltage of the capacitor is sampled to see whether the respective memory cell(s) conducted. If the memory cell conducts in response to Vcgr, the trip latch 468 trips, indicating that the threshold voltage of the memory cell is less than Vcgr. There are many other techniques for sensing a memory cell.

Step 1808 is a determination of whether there is another verify reference level to apply to the selected word line. Again, a determination will be made whether the memory cells trip in response to the reference voltage applied to the selected word line.

Based on the reference level (if any) when the trip latch 468 in the sense amplifier 350 trips, the control die 304 will determine whether the memory cell has reached its target state. For example, if the memory cell is being programmed to the C data state, the control die 304 determines whether the threshold voltage of the memory cell is at least VvC.

In step 1810, memory cells that pass verify are locked out from further programming. In some embodiment, the voltage applied to the bit line during the programming phase is used to control whether the memory cell is locked out.

Figure 19:
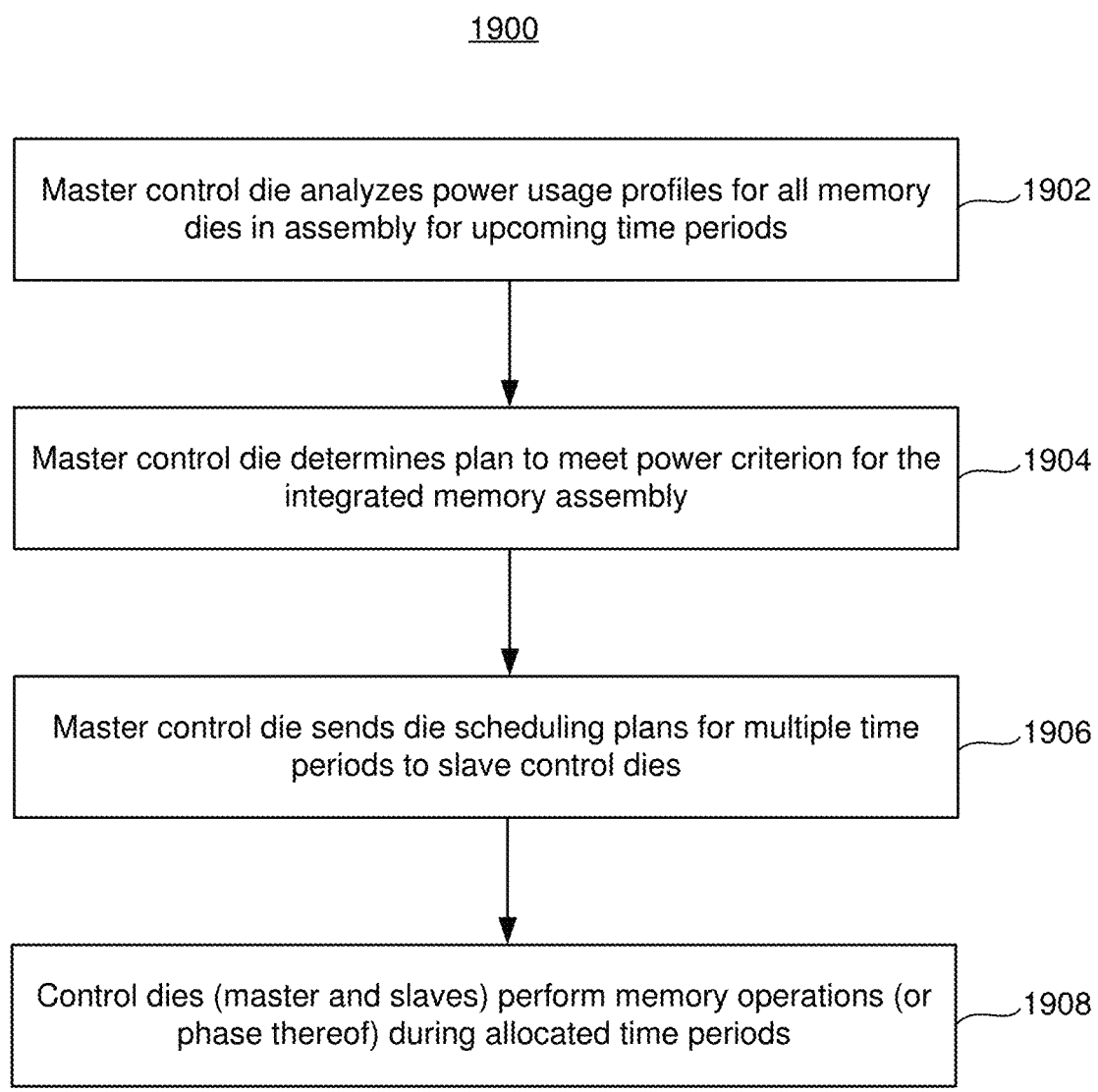
FIG. 19 depicts a flowchart of one embodiment of a process of regulating power/current usage by an integrated memory assembly.

Embodiments of a memory system 100 have a master control die 304a that regulates power/current usage of an integrated memory assembly 104. FIG. 19 depicts a flowchart of one embodiment of a process 1900 of regulating power/current usage in an integrated memory assembly 104. Process 1900 is performed in integrated memory assembly 104.

Step 1902 includes a master control die 304a analyzing a power/current usage profile for each memory die 302 in the integrated memory assembly 104 for upcoming time periods. The power/current usage profiles are estimates of power/current usage for memory operations that are to be performed in the near future. In one embodiment, each control die 304 determines the power/current usage profiles for the memory die 302 (or dies) that it controls, and sends those profiles to the master control die 304a. Reference will now be made to FIG. 20, to discuss example current usage profiles of memory dies 302. In some embodiments, each slave control die 304b sends usage profiles to the master control die 304a based on example current usage profiles such as depicted in FIG. 20.

FIG. 20 depicts several plots that show examples of current (e.g., Icc) usage profiles for several memory dies 302. Plot 2002 depicts a current usage profile for a memory die referred to as Die 0. Plot 2004 depicts a current usage profile for a memory die referred to as Die 1. Plot 2006 depicts a current usage profile for a memory die referred to as Die n.

Each plot 2002, 2004, 2006 covers three time periods (Time Period 1, Time Period 2, Time Period 3) for the sake of illustration. Each time period is for the future. Thus, the current usage profiles are estimates or predictions of the current usage for each upcoming time period. In one embodiment, the estimated current usage is an estimate of the peak current consumption during that time period. In one embodiment, the estimated current usage is an estimate of the average current consumption during that time period.

In the example of FIG. 20, the estimated current usage for Die 0 is represented by line 2008a for Time Period 1, line 2008b for Time Period 2, and, line 2008c for Time Period 3. The estimated current usage for Die 1 is represented by line 2010a for Time Period 1, line 2010b for Time Period 2, and, line 2010c for Time Period 3. The estimated current usage for Die n is represented by line 2012a for Time Period 1, line 2012b for Time Period 2, and, line 2012c for Time Period 3. The estimated current usages are depicted as constant values for a specific time period, which simplifies the analysis of the estimated current usages. Thus, the control dies 304 can simply report one value to the master control die for each time period. However, the estimated current usage could have more than one value per time period. For example, the estimated current usage could include both the peak and the average current usage for each time period.

There could be more or fewer than three time periods in the power usage profile for each memory die 302. The length of the time periods can be set relatively small to help provide for fine grained control. For example, the time periods could be on the order of time it takes to perform a program verify phase of a program operation.

Figure 21:
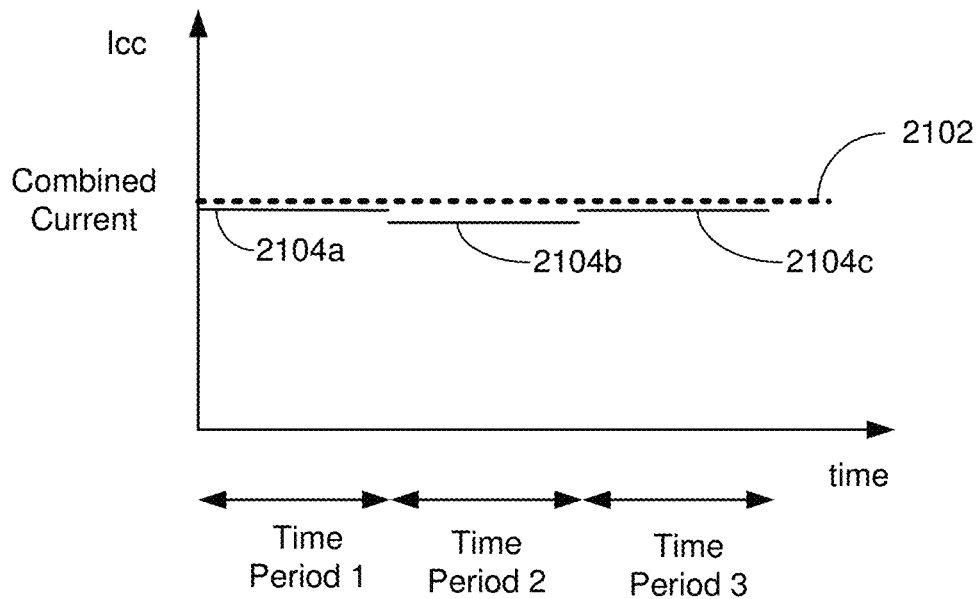
FIG. 21 depicts plots to illustrate one example of combined current usage for all memory dies in the integrated memory assembly.

Returning again to the discussion of FIG. 19, step 1904 includes determining a plan to meet a power criterion for the integrated memory assembly 104, based on the analysis of step 1902. In one embodiment, the master control die 304a determines a power plan for executing memory operations in the memory dies 302 to keep a combined power usage of the integrated memory assembly 104 within a power budge. In one embodiment, the power plan includes a die scheduling plan for each memory die 302. In one embodiment, the power criterion includes a peak current consumption of the integrated memory assembly 104. As noted above, regulating the peak current may result in regulation of peak power. In one embodiment, the master control die 304a attempts to maximize the current usage in each of the time periods, while remaining within a maximum allowed current for the integrated memory assembly 104. Reference will now be made to FIG. 21 to illustrate remaining within a maximum allowed current for the integrated memory assembly 104.

FIG. 21 depicts plots to illustrate one example of combined current usage for all memory dies 302 in the integrated memory assembly 104. Dashed line 2102 represents a maximum allowed current for the integrated memory assembly 104. In one embodiment, dashed line 2102 represents a maximum allowed peak current for the integrated memory assembly 104. Line 2104a represents the total current consumption for all memory dies 302 in the integrated memory assembly 104 during time period 1. Line 2104b represents the total current consumption for the all memory dies 302 in the integrated memory assembly 104 during time period 2. Line 2104c represents the total current consumption for the all memory dies 302 in the integrated memory assembly 104 during time period 3. Note that lines 2104a, 2104b, and 2104c are current consumptions based on the estimates in the current profiles (see FIG. 20). In one embodiment, these are the peak current consumptions for the integrated memory assembly 104 for each time period.

In some embodiments, the master control die 304a selects which of the memory semiconductor dies perform a memory operation or a phase of a memory operation in a time period to maximize a combined power usage of the integrated memory assembly 104 while keeping the combined power/current usage of the integrated memory assembly 104 within the power/current budget. In some embodiments, the master control die 304a determines a combination of the memory semiconductor dies 302 to perform a phase of a program operation in a time period in order to maximize the power/current usage of the integrated memory assembly 104 in each time period while staying within a power/current usage limit for the integrated memory assembly 104.

Returning again to the discussion of FIG. 19, step 1906 includes the master control die 304a sending the die scheduling plans for multiple time periods to slave control dies 304b. Each die scheduling plan indicates when a memory operation or phase of a memory operation is to be performed. In one embodiment, a common clock signal (see FIG. 6) is used to coordinate or synchronize the operations. For example, the die scheduling plan may indicate which clock cycle a program phase is to begin, which clock cycle a program verify phase is to begin, etc. Note that the master control die 304a also controls a memory die 302. Therefore, the master control die 304a may generate a die scheduling plan for itself. In one embodiment, the master control die 304a sends the die scheduling plans by way of communication link 608, which avoids use of memory interface 322.

Step 1908 includes operating the memory dies 302 in each time period according to the die scheduling plans. In some embodiments, each control semiconductor die 304 determines when to perform each memory operation or phase of a memory operation based on a common clock signal. Note that in step 1908, each control semiconductor die communicates through the bond pads (e.g., 870, 872, 874, 876) to memory structures 326 in memory semiconductor dies 302 to perform the memory operations (or phases of the memory operations) at the appointed time periods.

Figure 22:
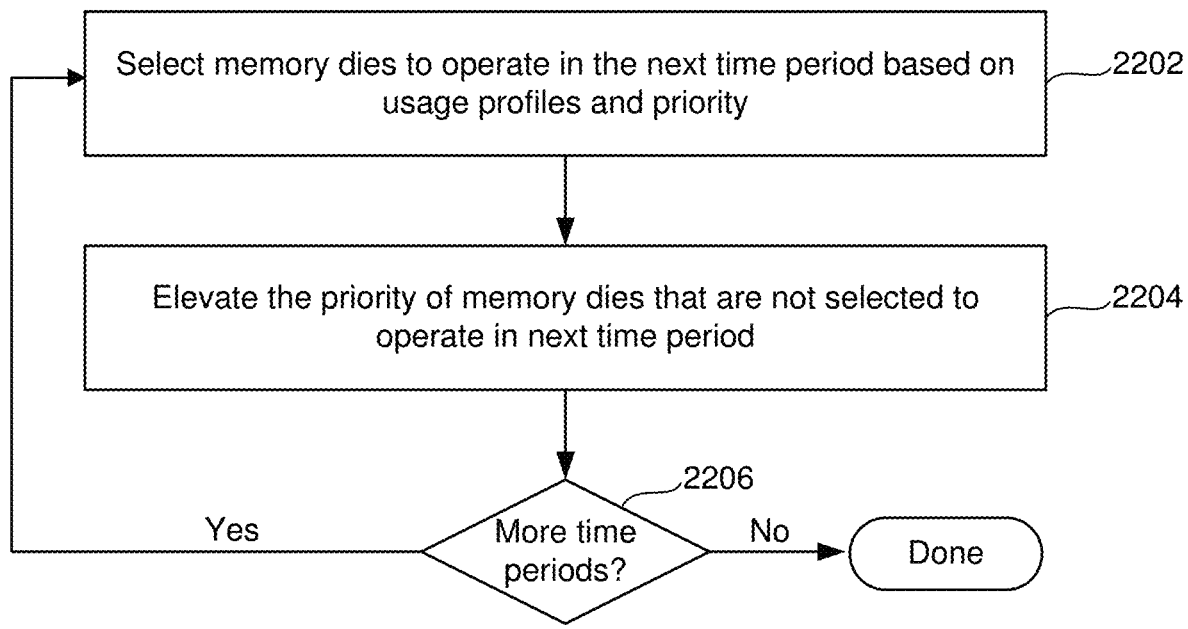
FIG. 22 depicts a flowchart of one embodiment of a process of a master control die developing a scheduling plan.

As noted above, the master control die 304a determines which memory dies 302 are to operate in upcoming time periods. It is possible that some memory dies 302 could get starved. Hence, in some embodiments, the priority of a memory die 302 is elevated in order to prevent starvation. FIG. 22 depicts a flowchart of one embodiment of a process of a master control die 304a developing a die scheduling plan. The process may be used in step 1904 of FIG. 19.

Step 2202 includes selecting memory dies 302 to operate in a next time period based on usage profiles and priority. An example of usage profiles is the estimated current usages depicted in FIG. 20. Initially, each memory die 302 is assigned the same default priority. Step 2202 results in a set of the memory dies 302 being selected to operate in a time period, such that a power/current criterion for that time period is met.

Step 2204 includes elevating a priority of memory dies 302 that were not selected in step 2202. Step 2206 includes a determination of whether the master control die 304a is going to consider more time periods for the plan. If so, then control passes to step 2202. In step 2202, the master control die 304a again selects memory dies 302 to operate in the next time period based on usage profiles and priority. Since the priority of previously unselected memory dies was elevated, such memory dies 302 have a greater chance of selection in step 2202. After a memory die 302 has been selected in step 2202, its priority may be reset to the default priority. The process concludes after all time periods have been considered.

Figure 23:
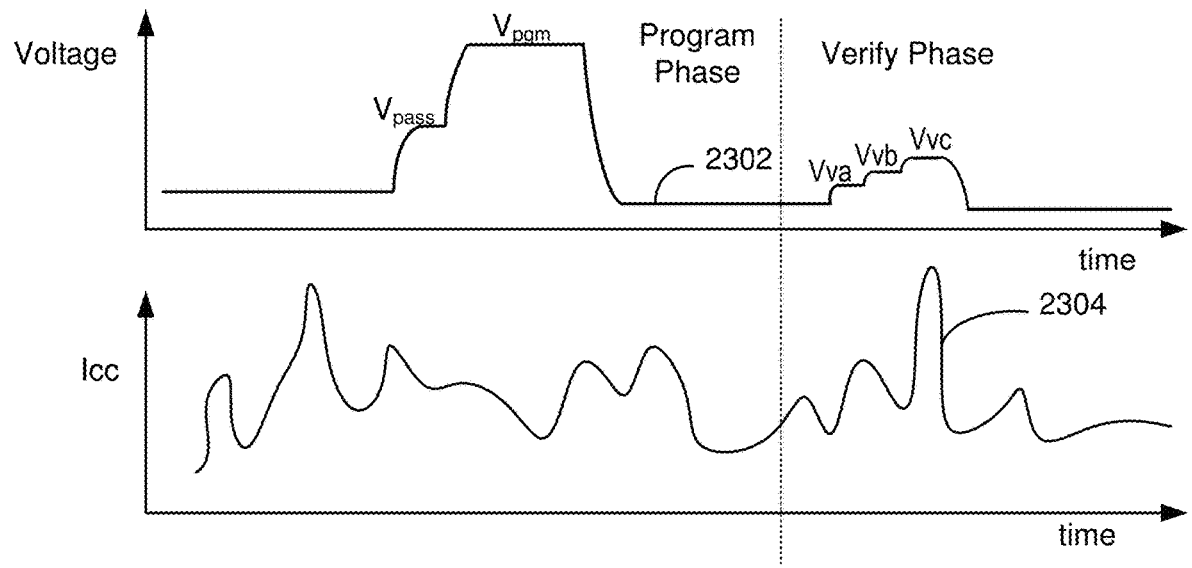
FIG. 23 depicts plots to show current usage for one program loop.

As noted above, in some embodiments, a control die 304 estimates power/current usage profiles for upcoming time periods. In some embodiments, these estimates are based on information each control die 304 stores that indicates how much power or current various memory operations or phases thereof take. FIG. 23 will be referred to in order to explain how such information may be determined. FIG. 23 depicts two plots to show current usage for one program loop. Plot 2302 depicts the voltage on the selected word line versus time. Plot 2304 depicts current versus time over the program loop. This current refers to the current drawn by the memory die 302. The current usage is a result of many other factors than the voltage applied to the selected word line. During the program phase, a program voltage (Vpgm) is applied to the selected word line. The voltage Vpass is a boosting voltage that is applied to all word line during programing (see FIG. 17). During the verify phase, one or more verify reference voltages are applied to the selected word line. In FIG. 23, VrA, VrB, and VrC are depicted. These may be VrA, VrB, and VrC depicted in FIG. 15A. Note that it is not required that all verify reference voltages be applied in each program loop. For example, in early program loops, the higher reference voltages (e.g., VvD, VvE, VvF, and VvG) may be skipped.

There may be some variation in current usage from one memory die 302 to the next. In some embodiments, the current plot 2304 is determined on a per memory die 302 basis. This could be determined offline, or during use. For example, a current plot 2304 may be determined for each memory die 302. The control die 304 may access data such as peak (or average) current usage for various phases of memory operations. These data could be stored in non-volatile memory in, for example, the memory die 302. For example, the stored data may indicate the peak current usage for the program phase, the peak current usage for the verify phase, peak current usage for a read operation, etc. There may be some variation in current usage from one program loop to the next due to factors such as the number of verify reference voltages that are applied to the selected word line (and hence the number of states that are sensed). Other factors can impact the current usage from one program loop to the next. Thus, the control die 302 may store current usage data for each loop of a program operation.

In some embodiments, current usage is primarily a concern during programming. However, current usage for other operations such as erase and read may also be determined. In some embodiments, erase operations includes an erase phase followed by an erase verify phase. Thus, an erase operation can include multiple phases similar to a program operation.

Figure 24:
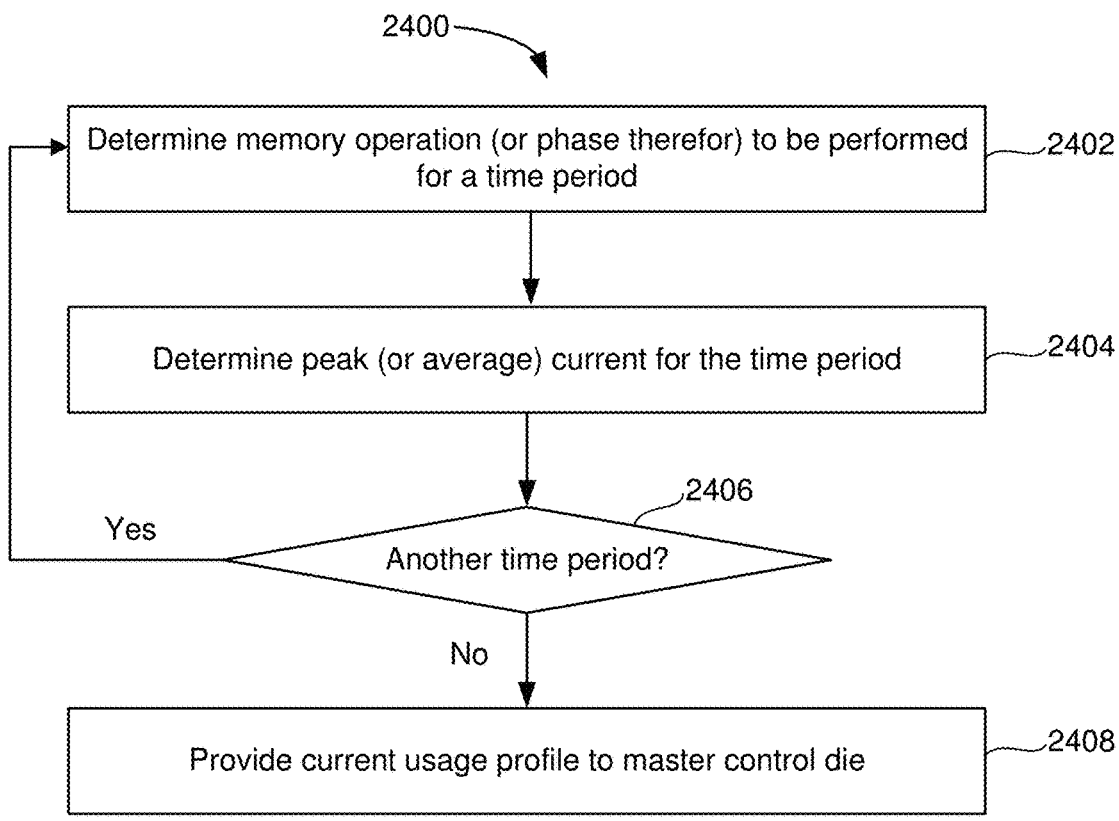
FIG. 24 depicts a flowchart of one embodiment of a process of a control die determining a power usage profile.

FIG. 24 depicts a flowchart of one embodiment of a process 2400 of a control die 304 determining a current usage profile. The current usage profile may be sent to the master control die 304a to allow the master control die to determine a power/current plan. Step 2402 includes the control die 302 determining a memory operation (or phase thereof) to be performed for a time period. In process 2400 it is assumed that the time periods are sufficiently small such that no more than one memory operation is performed per time period. However, the time periods may be made any size, such that in some embodiments more than one memory operation can be performed in a time period. In some cases, a memory operation will take multiple time periods to complete.

Step 2404 includes determining a peak current usage for the time period, given the memory operation (or phase thereof) to be performed. For example, with reference to FIG. 23, if the program phase of a program operation is to be performed, then the peak current for the program phase may be based on plot 2304. Likewise, if the verify phase of a program operation is to be performed, then the peak current for the verify phase may be based on plot 2304. As noted above, the control die 302 may store a table or the like containing data that indicates how much current is used in different phases of a program operation.

Step 2406 includes a determination if another time period is to be analyzed. If so, then steps 2402-2404 are performed again for the memory operation (or phase thereof) to be performed in the next time period. After a sufficient number of time periods have been analyzed, the control die 302 provides the current usage profile to the master control die 304a, in step 2408. In one embodiment, the current usage profile includes an estimate of peak current for each phase of a program operation to be performed.

Figure 25:
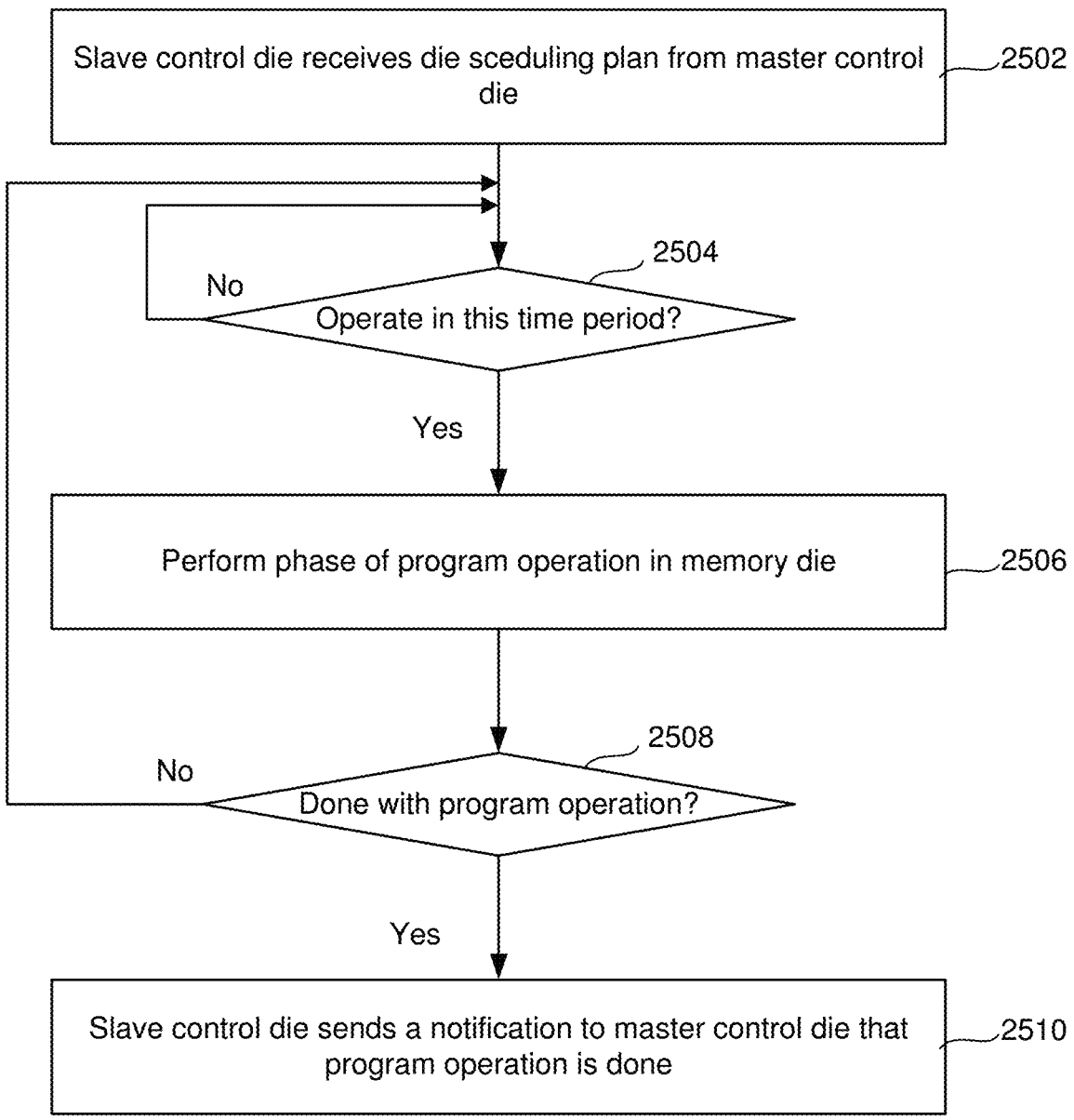
FIG. 25 depicts a flowchart of one embodiment of a process of a control die performing memory operations in accordance with a scheduling plan that is provided by a master control die.

FIG. 25 depicts a flowchart of one embodiment of a process 2500 of a slave control die 304b performing memory operations in accordance with a die scheduling plan that is provided by a master control die 304a. The process is described with respect to a program operation, but can be modified for other memory operations. In step 2502, the slave control die 304b receives a die scheduling plan from the master control die 304a. In some embodiments, the master control die 304a provides the die scheduling plan over communication link 608. The communication link 608 provides a pathway between the master die 304a and slave die 304b that avoids the use of memory interface 322. In some embodiments, at least a portion of communication link 608 runs through a control die TSV 1112. A portion of the communication link 608 may also run through a memory die TSV 1114.

Step 2504 includes a determination, by the slave control die 304b, of whether the die scheduling plan indicates that a phase of the program operation is to be performed for this time period. In one embodiment, the die scheduling plan indicates a number of upcoming time periods, and whether each time period has been allocated to the memory die 302 that is controlled by this slave control die 304b. In one embodiment, each of the control dies 304 accesses a common clock to track the time periods. Each control die 304 may count the clock cycles in order to translate the clock cycles to the time periods, for example. If the slave control die 304b is not authorized to perform a phase of the program operation in this time period, then the slave control die 304b waits until a time period that has been allocated to it occurs. When such a time period occurs, the slave control die 304b performs a phase of the program operation in the allocated time period, in step 2506. Step 2508 includes a determination, by the slave control die 304b, of whether the program operation is completed. In step 2508, completion means that no more program loops are to be performed. If the program operation is not yet complete, then control passes to step 2504 to determine whether the control die 304 has been allocated the next time period. After the program operation is completed (step 2508=yes), control passes to step 2510. In step 2510, the slave control die 304b sends a notification to the master control die 304a that the program operation is complete.

Figure 26:
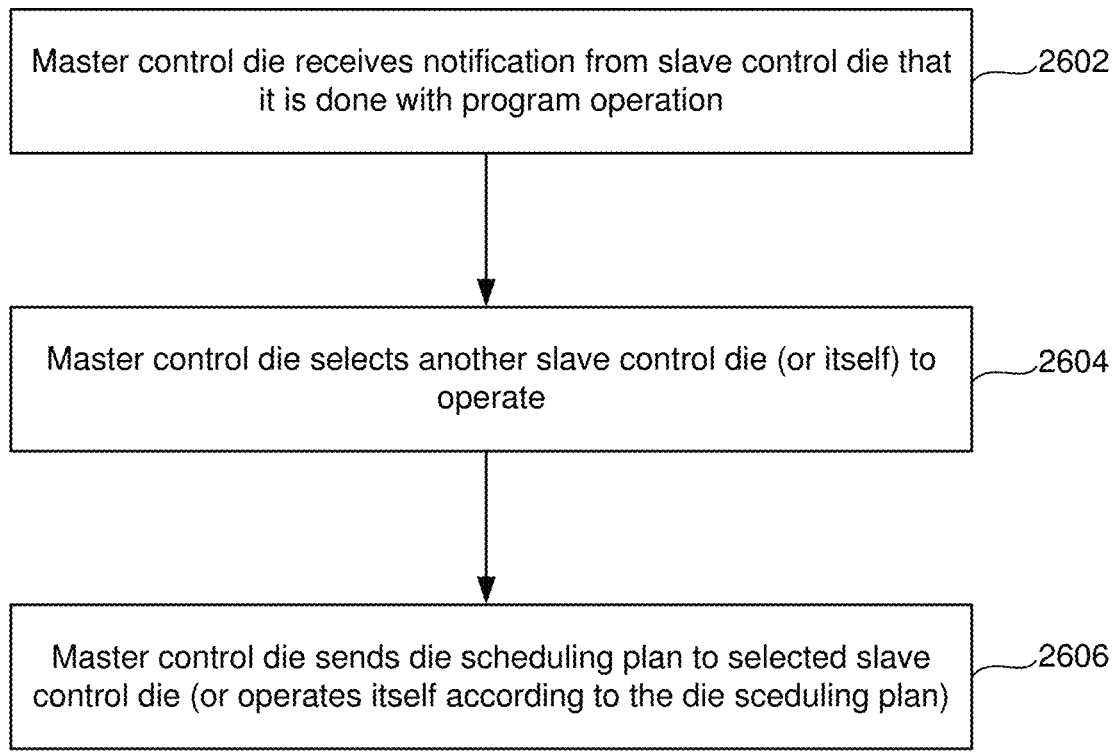
FIG. 26 depicts a flowchart of one embodiment of a process of a master control die updating scheduling plans in response to receiving notification from a control die that it has completed its program operation.

Since the number of program loops to be performed is unknown prior to the master control die 304a sending out the die scheduling plan, the master control die 304a could potentially allocate one or more time periods to a slave control die 304b that the slave control die 304b does not use. FIG. 26 depicts a flowchart of one embodiment of a process 2600 of a master control die 304a updating die scheduling plans in response to receiving notification from a slave control die 304b that it has completed its program operation. This process 2600 allows for both fine-grained control, as well as assuring that the maximum power/current is used in each time period. In other words, process 2600 can be used to avoid not using the maximum allowed power/current, and therefore not achieving maximum efficiency.

Step 2602 includes the master control die 304a receiving a notification from the slave control die 304b that the slave control die 304b has completed a program operation. Note that completing the program operation means that no more program loops are to be performed. As with other communication between the master control die 304a and the slave control die 304b, communication link 608 may be used. Therefore, the memory interface 322 need not be used for this communication. Step 2604 includes the master control die 304a selecting another slave control die (or itself) to operate in the previously allocated time period(s). Step 2606 includes the master control die 304a sending a die scheduling plan to the selected slave control die. Alternatively, the master control die 304a may use the time period to perform a memory operation in the memory die 302 it controls.

In view of the above, it can be seen that a first embodiment includes an apparatus comprising a stack of semiconductor dies comprising a plurality of control semiconductor dies and a plurality of memory semiconductor dies. Each semiconductor die in the stack is affixed to at least one other semiconductor die in the stack. Each memory semiconductor die comprises a memory structure having non-volatile memory cells, wherein each control semiconductor die is configured to control operation in the memory structure of at least one of the memory dies. The control semiconductor dies comprise a master control die and a plurality of slave control dies. The master control die comprises one or more control circuits configured to determine a power plan for executing memory operations in the plurality of memory semiconductor dies to keep a combined power usage of the stack within a power budget. The power plan includes a slave die scheduling plan for each slave control die and a master die scheduling plan for the master control die. Each die scheduling plan indicates when memory operations and/or phases of memory operations are to be performed. The one or more control circuits of the master control die are further configured to send one of the slave die scheduling plans to each slave control die in the stack. Each respective control semiconductor die comprises one or more control circuits configured to perform the memory operations and/or the phases of the memory operations at a time when the scheduling plan for the respective control semiconductor die indicates.

In a second embodiment, and in furtherance of the first embodiment, the one or more control circuits of each control semiconductor die are further configured to determine when to perform the memory operations and/or the phases of the memory operations based on a common clock signal used by all control semiconductor dies in the stack.

In a third embodiment, and in furtherance of the first or second embodiments, the scheduling plan for each respective slave control die indicates when the respective slave control die is to perform each phase of a program operation.

In a fourth embodiment, and in furtherance of any of the first to third embodiments, the one or more control circuits of each control semiconductor die are further configured to determine a power profile for a memory semiconductor die controlled by the respective control semiconductor die. Each power profile includes an estimated power usage of the memory semiconductor die for each of a plurality of upcoming time periods. The one or more control circuits of the master control die are further configured to determine the power plan based on the power profile for each memory semiconductor die.

In a fifth embodiment, and in furtherance of any of the first to fourth embodiments, the one or more control circuits of each control semiconductor die are further configured to provide an estimate of a peak current for each phase of a program operation to be performed. The one or more control circuits of the master control die are further configured to determine the power plan based on the estimates of the peak currents.

In a sixth embodiment, and in furtherance of any of the first to fifth embodiments, the one or more control circuits of the master control die are further configured to select which of the memory semiconductor dies perform a memory operation and/or a phase of a memory operation in a time period to keep a combined power usage of the stack within the power budget for the time period.

In a seventh embodiment, and in furtherance of any of the first to sixth embodiments, the one or more control circuits of the master control die are further configured to select which of the memory semiconductor dies perform a memory operation or a phase of a memory operation in a time period to maximize a combined power usage of the stack while keeping the combined power usage of the stack within the power budget for the time period.

In an eighth embodiment, and in furtherance of any of the first to seventh embodiments, the one or more control circuits of the master control die are further configured to elevate a priority for executing a memory operation or a phase of a memory operation in a time period for a memory semiconductor die in the stack in response to the memory semiconductor die having been prevented by the master control die from executing the memory operation or the phase of the memory operation in a previous time period.

In a ninth embodiment, and in furtherance of any of the first to eighth embodiments, the memory operations comprise one or more of a program operation, a read operation or an erase operation. The phases of the memory operations comprise one or more of a program phase or a program verify phase of a program operation.

In a tenth embodiment, and in furtherance of any of the first to ninth embodiments, the plurality of control semiconductor dies each comprise a through silicon via (TSV) comprising a communication link, wherein the master control die provides the slave die scheduling plans to the slave control dies over the communication link in the TSV of the respective slave control die.

Another embodiment includes a method comprising analyzing, at a master control die in a stack of semiconductor dies, power usage profiles over upcoming time periods for each of a plurality of memory semiconductor dies in the stack. The stack comprises the memory semiconductor dies and control semiconductor dies bonded by bond pads. The power usage profiles indicate an estimated power usage for each of the upcoming time periods for each of the memory semiconductor dies. The method comprises developing, at the master control die in the stack, a plurality of die scheduling plans to stay within a power budget of the stack for each of the time periods. The method comprises sending, from the master control die to each other control semiconductor die in the stack, one of the die scheduling plans that indicates in which time period a respective control semiconductor die is to perform phases of a programming operation. The method comprises controlling, by each respective control semiconductor die in the stack, performance of the phases of the programming operation in one of the memory semiconductor dies at the indicated time periods in the die scheduling plan for the respective control semiconductor die.

Another embodiment includes a non-volatile storage system, comprising an assembly comprising a plurality of control semiconductor dies and a plurality of memory semiconductor dies bonded by bond pads, wherein each memory semiconductor dies comprises a memory structure having non-volatile memory cells. Each control semiconductor die is configured to control operation of the memory structure of at least one of the memory semiconductor dies by issuing signals through the bond pads. Each control semiconductor die is further configured to estimate current usage for performing phases of programming operations in the memory semiconductor die controlled by the respective control semiconductor die for each of a plurality of future time periods. A master control die of the plurality of control semiconductor dies comprises one or more control circuits configured to determine a combination of the memory semiconductor dies to operate in each of the future time periods to stay within a current usage limit for the assembly based on the estimates of current usage of each memory semiconductor die in the assembly. The one or more control circuits of the master control die are further configured to instruct the other control semiconductor dies in the assembly which of the future time periods that each respective control semiconductor die is to perform each phase of the programming operations.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
 a stack of semiconductor dies comprising a plurality of control semiconductor dies and a plurality of memory semiconductor dies, wherein each semiconductor die in the stack is affixed to at least one other semiconductor die in the stack, wherein each memory semiconductor die comprises a memory structure having non-volatile memory cells, wherein each control semiconductor die is configured to control operation in the memory structure of at least one of the memory dies, wherein the control semiconductor dies comprise a master control die and a plurality of slave control dies;
 wherein the master control die comprises one or more control circuits configured to: determine a power plan for executing memory operations in the plurality of memory semiconductor dies to keep a combined power usage of the stack within a power budget, the power plan includes a slave die scheduling plan for each slave control die and a master die scheduling plan for the master control die, wherein each die scheduling plan indicates when memory operations and/or phases of memory operations are to be performed, wherein the memory operations comprise one or more of a program operation, a read operation or an erase operation, wherein the phases of the memory operations comprise one or more of a program phase or a program verify phase of a program operation; and
  send one of the slave die scheduling plans to each slave control die in the stack; and
 wherein each respective control semiconductor die comprises one or more control circuits configured to perform the memory operations and/or the phases of the memory operations at a time when the scheduling plan for the respective control semiconductor die indicates.

2. The apparatus of claim 1, wherein the one or more control circuits of each control semiconductor die are further configured to determine when to perform the memory operations and/or the phases of the memory operations based on a common clock signal used by all control semiconductor dies in the stack.

3. The apparatus of claim 1, wherein the scheduling plan for each respective slave control die indicates when the respective slave control die is to perform each phase of a program operation.

4. The apparatus of claim 1, wherein:
 the one or more control circuits of each control semiconductor die are further configured to determine a power profile for a memory semiconductor die controlled by the respective control semiconductor die, wherein each power profile includes an estimated power usage of the memory semiconductor die for each of a plurality of upcoming time periods; and
 the one or more control circuits of the master control die are further configured to determine the power plan based on the power profile for each memory semiconductor die.

5. The apparatus of claim 1, wherein:
 the one or more control circuits of each control semiconductor die are further configured to provide an estimate of a peak current for each phase of a program operation to be performed; and
 the one or more control circuits of the master control die are further configured to determine the power plan based on the estimates of the peak currents.

6. The apparatus of claim 1, wherein the one or more control circuits of the master control die are further configured to:
 select which of the memory semiconductor dies perform a memory operation and/or a phase of a memory operation in a time period to keep a combined power usage of the stack within the power budget for the time period.

7. The apparatus of claim 1, wherein the one or more control circuits of the master control die are further configured to:
 select which of the memory semiconductor dies perform a memory operation or a phase of a memory operation in a time period to maximize a combined power usage of the stack while keeping the combined power usage of the stack within the power budget for the time period.

8. The apparatus of claim 1, wherein the one or more control circuits of the master control die are further configured to:
 elevate a priority for executing a memory operation or a phase of a memory operation in a time period for a memory semiconductor die in the stack in response to the memory semiconductor die having been prevented by the master control die from executing the memory operation or the phase of the memory operation in a previous time period.

9. The apparatus of claim 1, wherein the plurality of control semiconductor dies each comprise a through silicon via (TSV) comprising a communication link, wherein the master control die provides the slave die scheduling plans to the slave control dies over the communication link in the TSV of the respective slave control die.

10. A method, comprising:

analyzing, at a master control die in a stack of semiconductor dies, power usage profiles over upcoming time periods for each of a plurality of memory semiconductor dies in the stack, wherein the stack comprises the memory semiconductor dies and control semiconductor dies bonded by bond pads, wherein the power usage profiles indicate an estimated power usage for each of the upcoming time periods for each of the memory semiconductor dies;

developing, at the master control die in the stack, a plurality of die scheduling plans to stay within a power budget of the stack for each of the time periods;

sending, from the master control die to each other control semiconductor die in the stack, one of the die scheduling plans that indicates in which time period a respective control semiconductor die is to perform phases of a programming operation; and controlling, by each respective control semiconductor die in the stack, performance of the phases of the programming operation in one of the memory semiconductor dies at the indicated time periods in the die scheduling plan for the respective control semiconductor die.

11. The method of claim 10, wherein developing the plurality of die scheduling plans includes developing a plan to stay within the power budget of the stack for each of the time periods and maximizing power usage for each of the time periods.

12. The method of claim 10, wherein sending, from the master control die to each other control semiconductor die in the stack, one of the die scheduling plans comprises:

sending the die scheduling plans in communication links in through silicon vias (TSVs) in the other control semiconductor dies.

13. A non-volatile storage system, comprising:

an assembly comprising a plurality of control semiconductor dies and a plurality of memory semiconductor dies bonded by bond pads, wherein each memory semiconductor dies comprises a memory structure having non-volatile memory cells;

wherein each control semiconductor die comprises means for controlling operation of the memory structure of at least one of the memory semiconductor dies by issuing signals through the bond pads, wherein each control semiconductor die i-s-further comprises means for estimating current usage for performing phases of programming operations in the memory semiconductor die controlled by the respective control semiconductor die for each of a plurality of future time periods;

wherein a master control die of the plurality of control semiconductor dies comprises control means for determining a combination of the memory semiconductor dies to operate in each of the future time periods to stay within a current usage limit for the assembly based on the estimates of current usage of each memory semiconductor die in the assembly; and wherein the control means of the master control die is further for instructing the other control semiconductor dies in the assembly which of the future time periods that each respective control semiconductor die is to perform each phase of the programming operations.

14. The non-volatile storage system of claim 13, wherein each control semiconductor die is configured to access a common clock and to perform each phase of the programming operations during the instructed time periods based on the common clock.

15. The non-volatile storage system of claim 13, wherein the control means of the master control die is further for:

determining a combination of the memory semiconductor dies to perform a phase of respective program operations in a time period in order to maximize the current usage of the assembly in the time period while staying within the current usage limit for the assembly.

16. The non-volatile storage system of claim 13, wherein a first control semiconductor die of the control semiconductor dies is further configured to send a notification to the master control die when it has completed a program operation.

17. The non-volatile storage system of claim 13, wherein the control of the master control die is further for:

increasing a priority of a memory semiconductor die for the future time period in response to the memory semiconductor die not being allowed to perform a phase of a program operation in a previous time period.

18. The non-volatile storage system of claim 13, wherein the control means of the master control die comprises processing means that is programmed to determine the combination of the memory semiconductor dies to operate in each of the future time periods to stay within the current usage limit for the assembly based on the estimated current usage of each memory semiconductor die in the assembly.

19. The non-volatile storage system of claim 16, wherein the control means of the master control die is further for:

allocating a time period that had been given to the first control semiconductor die to a second control semiconductor die of the control semiconductor dies; and notifying the second control semiconductor die that it is to perform a phase of a program operation in the allocated time period.

* * * * *